US012628357B2

(12) United States Patent
Chen et al.

(10) Patent No.: US 12,628,357 B2
(45) Date of Patent: May 12, 2026

(54) FERROMAGNETIC PLATES FOR ENHANCING INDUCTANCE AND METHODS OF FORMING THE SAME

(71) Applicant: Taiwan Semiconductor Manufacturing Company Limited, Hsinchu (TW)

(72) Inventors: Yu-Sheng Chen, Hsinchu (TW); Hsien Jung Chen, Hsinchu (TW); Kuen-Yi Chen, Hsinchu City (TW); Chien Hung Liu, Hsinchu (TW); Yi Ching Ong, Hsinchu (TW); Yu-Jen Wang, Hsinchu City (TW); Kuo-Ching Huang, Hsinchu City (TW); Harry-Hak-Lay Chuang, Zhubei city (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 866 days.

(21) Appl. No.: 17/882,670

(22) Filed: Aug. 8, 2022

(65) Prior Publication Data
US 2024/0047508 A1 Feb. 8, 2024

(51) Int. Cl.
*H10D 1/20* (2025.01)
(52) U.S. Cl.
CPC ..................................... *H10D 1/20* (2025.01)
(58) Field of Classification Search
CPC .............. H01L 23/5227; H01L 23/645; H01L 2924/19042; H01L 23/5225; H01L 2924/19011; H01L 2924/19015; H01L 2924/30107; H01L 2924/00; H01L 21/4857; H01L 23/60; H10D 1/20; H01F 2017/0066; H01F 41/046; H01F 10/324; H01F 3/10; H01F 10/265; H01F 41/02; H01F 5/00; H01F 5/003; H01F 1/0315; H01F 10/3231; H01F 2017/008; H01F 27/366; H01F 27/36; H01F 17/0013;
(Continued)

(56) References Cited

U.S. PATENT DOCUMENTS 6,069,397 A * 5/2000 Cornett ............... H01L 23/5227
257/516
8,432,017 B2 * 4/2013 Kuo ........................ H01F 5/003
257/532

(Continued)

*Primary Examiner* — Mark W Tornow
*Assistant Examiner* — Priya M Rampersaud
(74) *Attorney, Agent, or Firm* — The Marbury Law Group, PLLC

(57) ABSTRACT

A semiconductor structure includes an inductive metal line located in a dielectric material layer that overlies a semiconductor substrate and laterally encloses a first area; and an array of first ferromagnetic plates including a first ferromagnetic material and overlying or underlying the inductive metal line. For any first point that is selected within volumes of the first ferromagnetic plates, a respective second point exists within a horizontal surface of the inductive metal line such that a line connecting the first point and the second point is vertical or has a respective first taper angle that is less than 20 degrees with respective to a vertical direction. The magnetic field passing through the first ferromagnetic plates is applied generally along a hard direction of magnetization and the hysteresis effect is minimized.

20 Claims, 32 Drawing Sheets

(58) Field of Classification Search
CPC ...... H01F 41/302; H01F 41/307; H01F 27/24;
H10N 50/10; H10N 50/01; H10N 50/85;
H10N 50/80; H10N 59/00; Y10T
29/4902; Y10T 29/49043; G01R 15/205;
G01R 33/093; G01R 33/1284; G01R
33/096; G11B 5/676; G11B 5/39; G11B
5/3909; B82Y 25/00; B82Y 40/00; H10B
61/00; H10B 41/20; H10B 41/50; H10B
43/20; H10B 43/50; G11C 11/15; H01P
1/218; H05K 1/0233
See application file for complete search history.

(56) References Cited

U.S. PATENT DOCUMENTS

| | | | |
|---|---|---|---|
| 9,105,381 B2 * | 8/2015 | Girard | H01F 5/003 |
| 11,165,128 B1 * | 11/2021 | Degawa | H01P 1/218 |
| 2007/0188287 A1 * | 8/2007 | Lien | H01F 41/34 |
| | | | 336/200 |
| 2022/0157744 A1 * | 5/2022 | Chiang | H01L 23/645 |

* cited by examiner

650

A1

658(40)

hd1 hd2

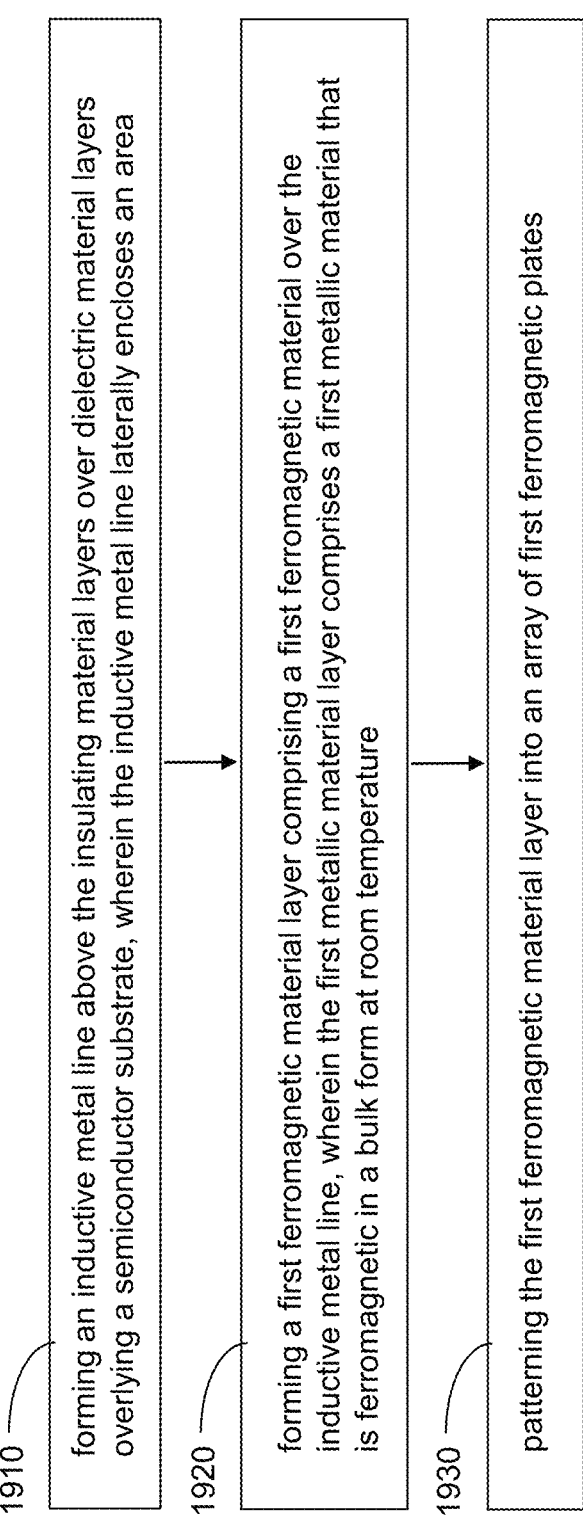

1910 forming an inductive metal line above the insulating material layers over dielectric material layers overlying a semiconductor substrate, wherein the inductive metal line laterally encloses an area 1920 forming a first ferromagnetic material layer comprising a first ferromagnetic material over the inductive metal line, wherein the first metallic material layer comprises a first metallic material that is ferromagnetic in a bulk form at room temperature 1930 patterning the first ferromagnetic material layer into an array of first ferromagnetic plates

FIG. 19

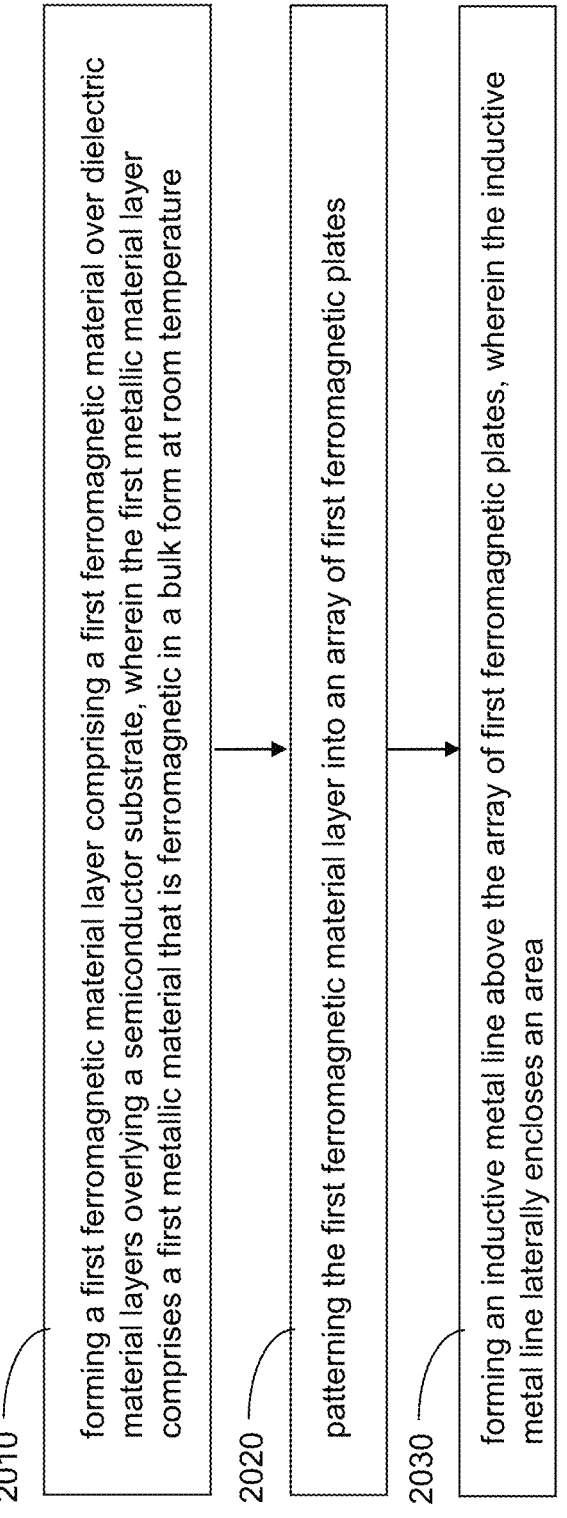

2010 — forming a first ferromagnetic material layer comprising a first ferromagnetic material over dielectric material layers overlying a semiconductor substrate, wherein the first metallic material layer comprises a first metallic material that is ferromagnetic in a bulk form at room temperature 2020 — patterning the first ferromagnetic material layer into an array of first ferromagnetic plates 2030 — forming an inductive metal line above the array of first ferromagnetic plates, wherein the inductive metal line laterally encloses an area

FIG. 20

FERROMAGNETIC PLATES FOR ENHANCING INDUCTANCE AND METHODS OF FORMING THE SAME

BACKGROUND

Metal lines at interconnect-level dielectric material layers may be used to provide inductor structures in an integrated circuit. Such inductor structures tend to provide a low per-volume inductance, and thus, tend to occupy a significant volume in the integrated circuit. Inductor structures providing a higher per-volume inductance are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 is a first flowchart illustrating steps for forming an exemplary structure according to an embodiment of the present disclosure.

FIG. 20 is a second flowchart illustrating steps for forming an exemplary structure according to an embodiment of the present disclosure.

DETAILED DESCRIPTION

Figure 1:
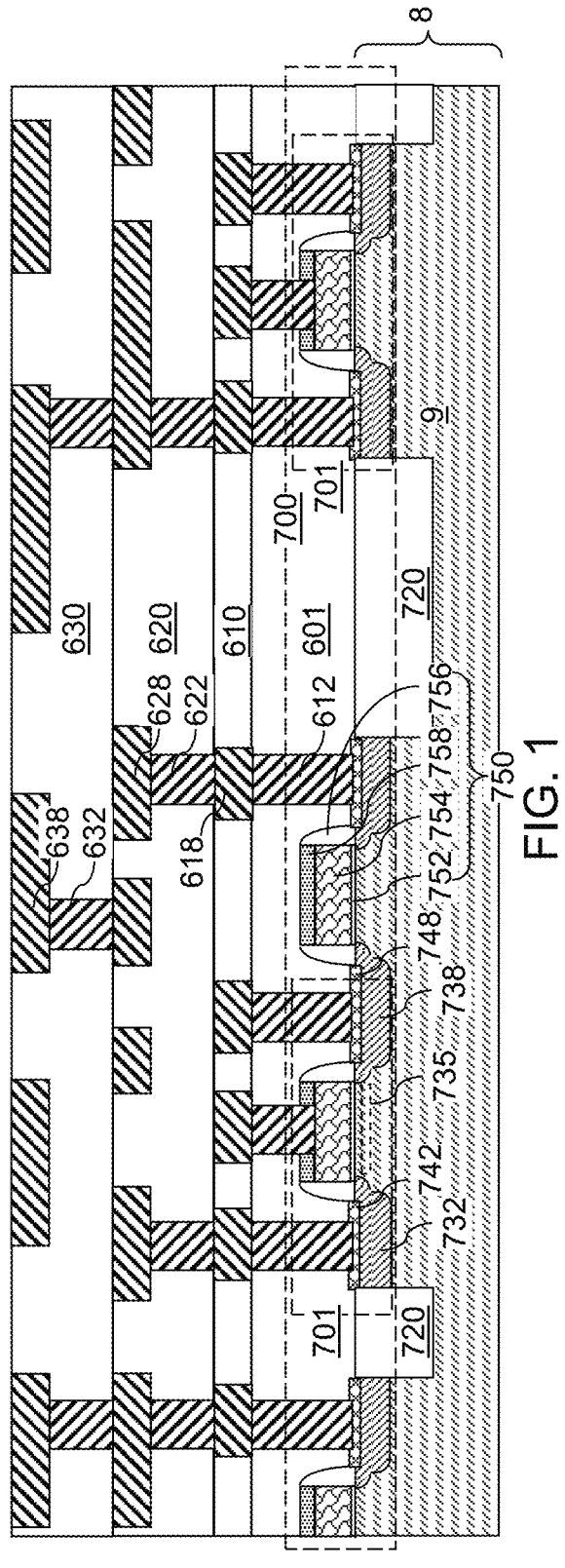
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range. Ordinals such as "first," "second," "third," etc. are not an inherent part of a name of any element, and are used only for the purpose of individually identifying multiple elements having the same, or similar, characteristics, and thus, different ordinals may be used for a same element across the specification and the claims. For example, a second element in the specification may be referred to as a first element in the claims.

The present disclosure is directed to semiconductor devices, and particularly to a semiconductor structure including an inductor structure such as an inductive metal line.

Embedded inductors may be used in integrated circuits to provide inductance without using discrete external inductors. Such embedded inductors provide less parasitic resistance and less parasitic capacitance. In addition, such embedded inductors occupy a lesser area than discrete external inductors. A thick metal line within a dielectric material layer may be formed over semiconductor devices so as to be used as an embedded inductor. Such an embedded inductor has a low inductance density because the number of turns that a thick metal line may provide within a single metal interconnect level is limited. Typically, a large area is needed to provide sufficient inductance for such inductor structures. In other words, despite being more compact compared to discrete external inductors, embedded inductors are still area-intensive.

According to an aspect of the present disclosure, an embedded inductor structure is provided, which includes ferromagnetic plates that are positioned such that the magnetic field generated by an inductive metal line is substantially parallel to the hard axis of magnetization of the ferromagnetic plates. The ferromagnetic plates may be formed with a perpendicular magnetic anisotropic (PMA) material having an easy axis of magnetization along a vertical direction, which is perpendicular to the direction of magnetization in the ferromagnetic plates. The ferromagnetic plates may be placed directly above, or directly below, the inductive metal line, or in the vicinity of such areas so that magnetic field is substantially horizontal within the ferromagnetic plates.

Alignment of the hard axis of magnetization with the direction of the of the magnetic field generated by the inductive metal coil eliminates or reduces the hysteresis effect of the ferromagnetic material. Reducing or eliminating the hysteresis effect of the ferromagnetic material increases the repeatability of the magnetic response of the ferromagnetic plates. Further, the saturation magnetization of the ferromagnetic material may be avoided over a wide range of magnetic field intensities for the magnetic field that is generated by the inductive metal line. In other words, a large field window to saturation magnetization (Ms) may be provided by the inductor structures of the present disclosure. The various embodiments of the present disclosure provide inductive structures having a high areal inductance density and having a high Q-factor. The sequence of processing steps used to form the inductor structure of the present disclosure is compatible with standard complementary metal-oxide-semiconductor (CMOS) manufacturing processes. The various aspects of the present disclosure are now described with reference to accompanying figures.

Referring to FIG. 1, a first exemplary structure according to a first embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as a CMOS circuitry 700. One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective source region 732 or a respective drain region 738 that is subsequently electrically connected to a node of a respective memory cell that may be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

Various metal interconnect structures embedded within dielectric material layers may be subsequently formed over the substrate 8 and the semiconductor devices thereupon (such as field effect transistors 701). In an illustrative example, the dielectric material layers may include, for example, a contact-level dielectric material layer 601 that surrounds device contact via structures 612 connected to the source regions 732 and drain regions 738, a first interconnect-level dielectric material layer 610, a second interconnect-level dielectric material layer 620, a third interconnect-level dielectric material layer 630, etc. The metal interconnect structures may include the device contact via structures 612 formed in the first dielectric material layer 601 and contacting a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, and third metal line structures 638 formed in an upper portion of the third interconnect-level dielectric material layer 630, etc. While the present disclosure is described using an embodiment in which three levels of metal interconnect structures are formed prior to formation of inductor-level structures, embodiments are expressly contemplated herein in which a lesser number of levels of metal interconnect structures or a greater number of level of metal interconnect structures are formed prior to formation of the inductor-level structures.

Generally, each of the dielectric material layers (601, 610, 620, 630) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. In one embodiment, the second metal via structures 632 and the third metal line structures 638 may be formed as integrated line and via structures by a dual damascene process. The metal interconnect structures (612, 618, 622, 628, 632, 638) may be electrically connected to a respective one of the semiconductor devices that are located on the substrate 8. The dielectric material layers (601, 610, 620, 630) are herein referred to as lower-lower-level dielectric material layers. The metal interconnect structures (612, 618, 622, 628, 632, 638) formed within in the lower-level dielectric material layers are herein referred to as lower-level metal interconnect structures.

An inductor structure may be subsequently deposited over the dielectric material layers (601, 610, 620, 630) and the metal interconnect structures (612, 618, 622, 628, 632, 638). The set of all dielectric material layer that are formed prior to formation of an array of transistors and an array of memory cells, such as thin-film transistors and ferroelectric memory cells, is collectively referred to as lower-level dielectric material layers (601, 610, 620, 630). The set of all metal interconnect structures that is formed within the lower-level dielectric material layers (601, 610, 620, 630) is herein referred to as first metal interconnect structures (612, 618, 622, 628, 632, 638). Generally, first metal interconnect structures (612, 618, 622, 628, 632, 638) formed within at least one lower-level dielectric material layer (601, 610, 620, 630) may be formed over the semiconductor material layer 9 that is located in the substrate 8.

Figure 2A:
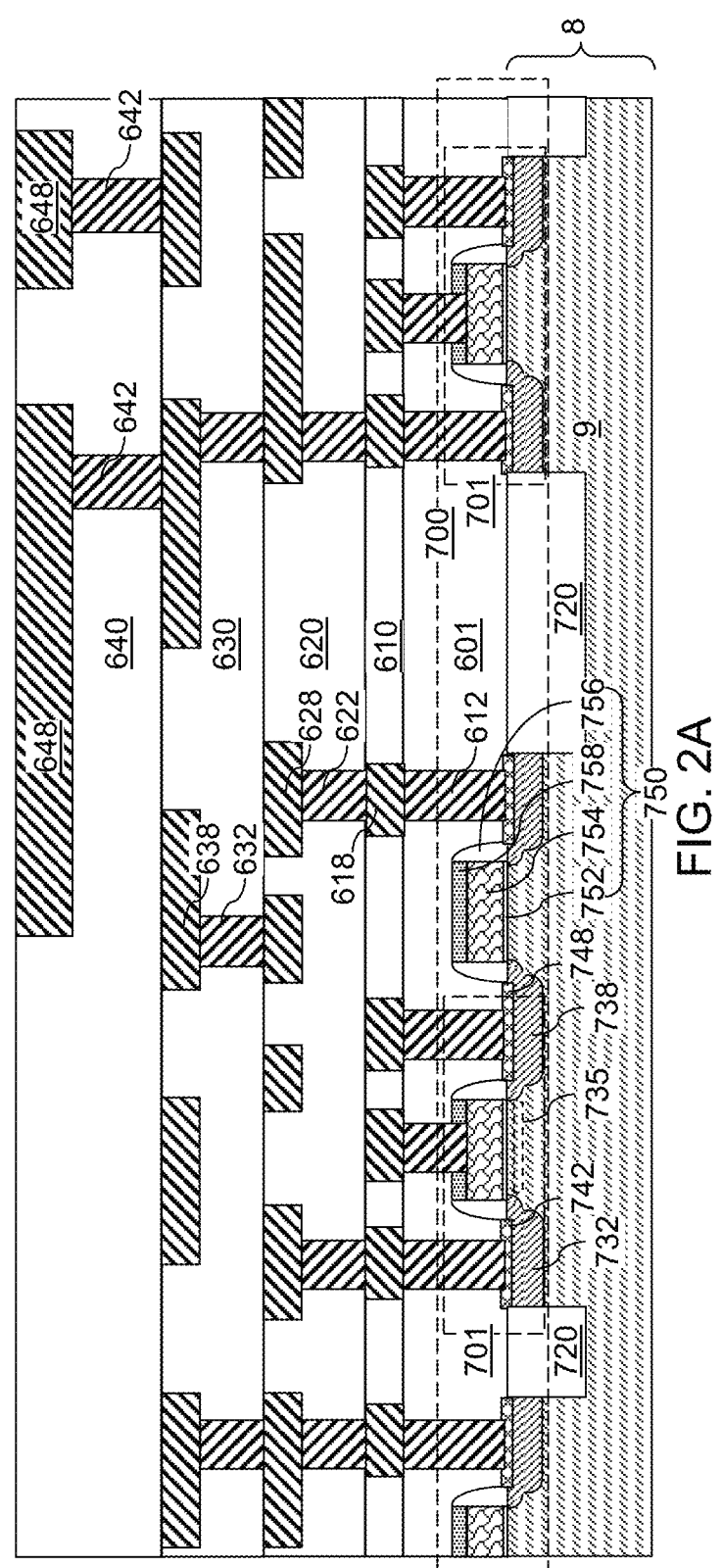
FIG. 2A is a vertical cross-sectional view of the first exemplary structure after formation of under-inductor-level metal interconnect structures according to an embodiment of the present disclosure.
Figure 2B:
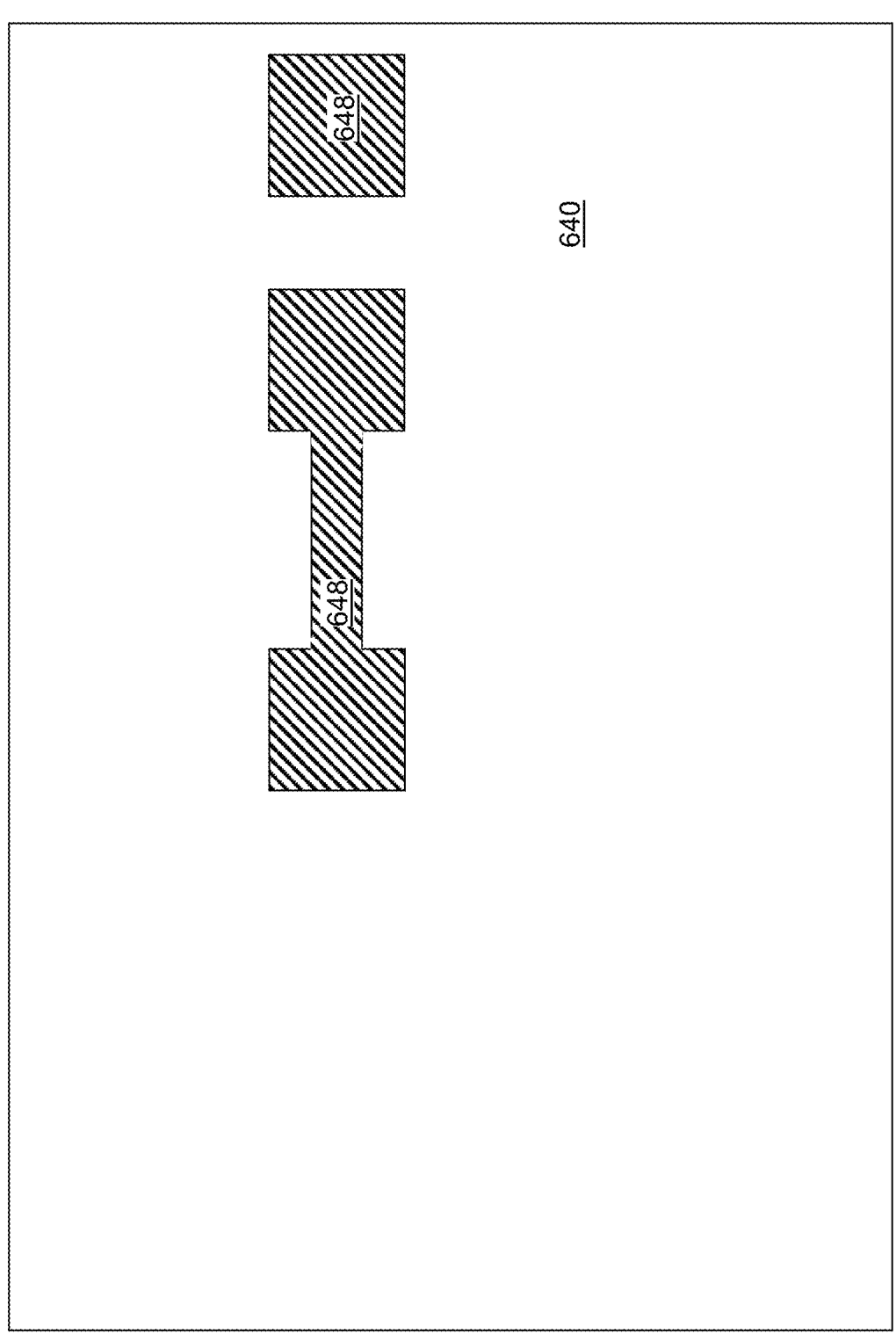
FIG. 2B is a top-down view of the first exemplary structure of FIG. 2A.

Referring to FIGS. 2A and 2B, a fourth interconnect-level dielectric material layer 640 may be formed over the third interconnect-level dielectric material layer 630. Generally, the fourth interconnect-level dielectric material layer 640 may comprise any material that may be used for the first, second, and third interconnect-level dielectric material layers (610, 620, 630). Via cavities and line cavities may be formed in the fourth interconnect-level dielectric material layer 640 by performing lithographic patterning steps and anisotropic etch steps.

For example, a first photoresist layer (not shown) may be applied over the fourth interconnect-level dielectric material layer 640, and may be lithographically patterned to form a pattern of via openings. A first anisotropic etch process may be performed to transfer the pattern of via openings into an upper portion of the fourth interconnect-level dielectric material layer 640. In-process via cavities may be formed in the upper portion of the fourth interconnect-level dielectric material layer 640. The first photoresist layer may be removed, for example, by ashing. A second photoresist layer (not shown) may be applied over the fourth interconnect-level dielectric material layer 640, and may be lithographically patterned to form a pattern of line-shaped openings. The areas of the line-shaped openings may include the areas of the in-process via cavities. A second anisotropic etch process may be performed to transfer the pattern of the line-shaped openings into an upper portion of the fourth interconnect-level dielectric material layer 640 and to vertically extend the in-process via cavities. Integrated line-and-via cavities may be formed in the fourth interconnect-level dielectric material layer 640. Each integrated line-and-via cavity may include a line cavity that is formed in an upper portion of the fourth interconnect-level dielectric material layer 640 and at least one via cavity that extends from a horizontal bottom surface of the line cavity through a lower portion of the fourth interconnect-level dielectric material layer 640 down to a top surface of a respective one of the third metal line structures 638. The second photoresist layer may be removed, for example, by ashing.

At least one metallic material may be deposited in the integrated line-and-via cavities, and excess portions of the at least one metallic material may be removed from above the horizontal plane including the top surface of the fourth interconnect-level dielectric material layer 640. Each remaining portion of the at least one metallic material constitutes an integrated line and via structure that includes a respective fourth metal line structure 648 and at least one respective third metal via structure 642.

While the present disclosure is described using an embodiment in which the fourth metal line structures 648 and the third metal via structures 642 are formed as integrated line and via structures through a dual damascene integration scheme, embodiments are expressly contemplated herein in which the fourth metal line structures 648 and the third metal via structures 642 are formed through different types of dual damascene integration schemes or through a single damascene integration scheme in which the fourth interconnect-level dielectric material layer 640 is formed as two separate layers and the third metal via structures 642 and the fourth metal line structures 648 are formed using different metal deposition processes and metal planarization processes.

Generally, the fourth metal line structures 648 and the third metal via structures 642 may be formed in a pattern that facilitates electrical connection to an inductor structure to be subsequently formed. According to an aspect of the present disclosure, the fourth metal line structures 648 and the third metal via structures 642 are formed at a level that underlies an inductive metal line to be subsequently formed, and as such, are herein referred to as under-inductor-level metal interconnect structures, i.e., metal interconnect structures that underlie an inductor structure to be subsequently formed. For example, the fourth metal line structures 648 may comprise two pad-shaped metal portions that are provided in areas in which two end portions of the inductor structure are to be subsequently formed.

Figure 3A:
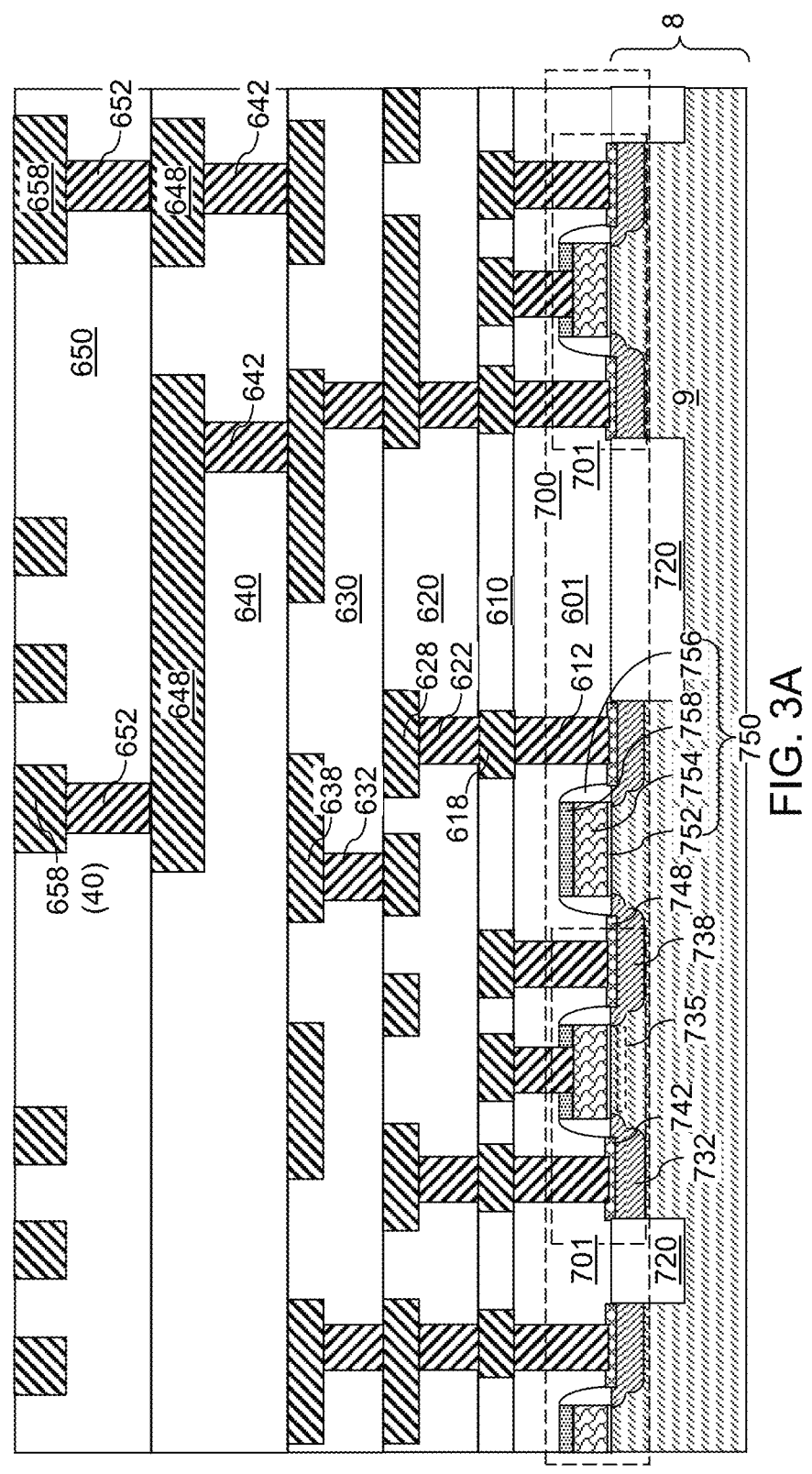
FIG. 3A is a vertical cross-sectional view of the first exemplary structure after formation of an inductive metal line and inductor-level metal interconnect structures according to an embodiment of the present disclosure.
Figure 3B:
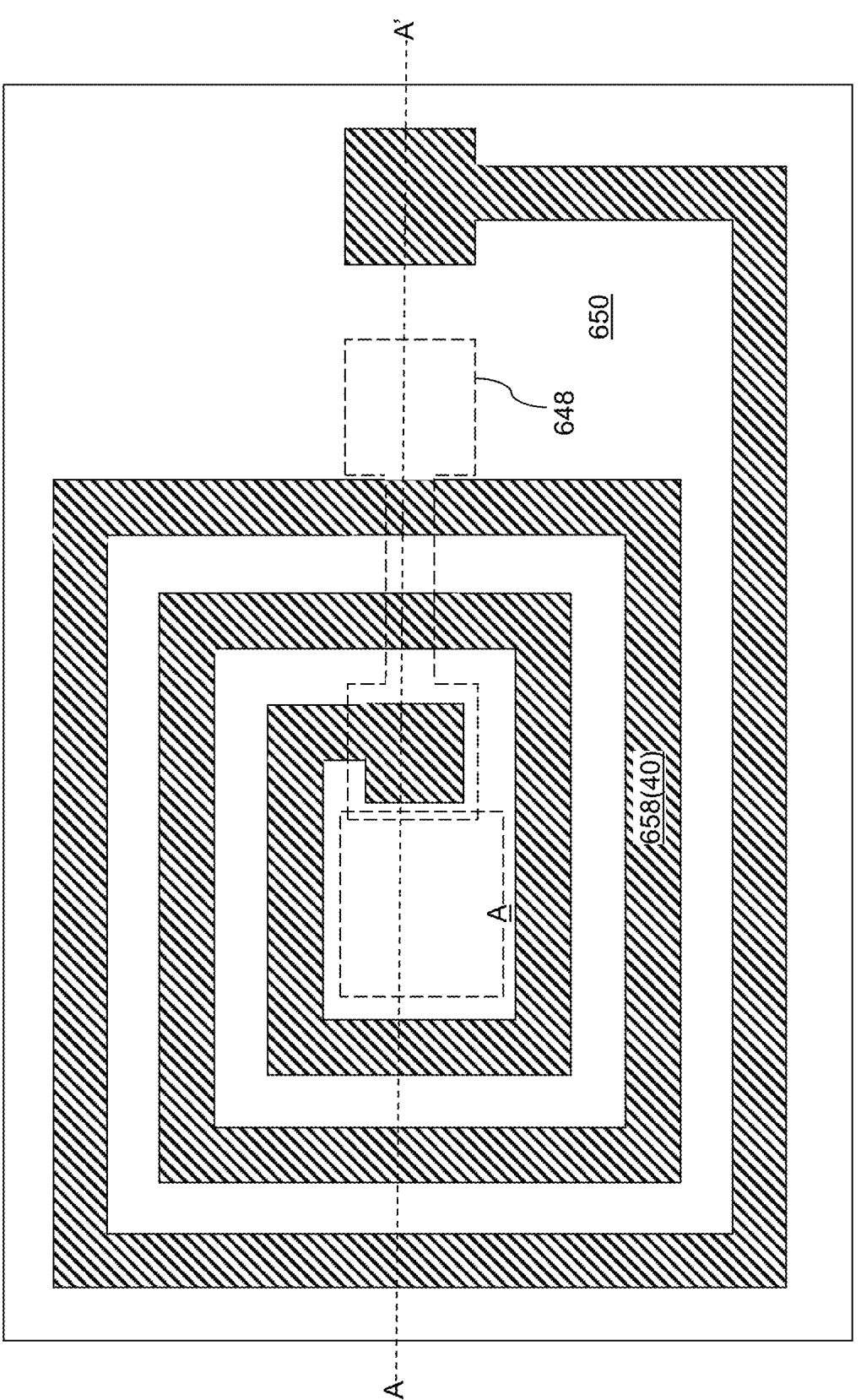
FIG. 3B is a top-down view of the first exemplary structure of FIG. 3A.

Referring to FIGS. 3A and 3B, an inductor-level dielectric material layer may be formed. The vertical cross-sectional view shown in FIG. 3A is along line AA' in FIG. 3B. In embodiments in which the inductor-level dielectric material layer is formed on a top surface of the fourth interconnect-level dielectric material layer 640, the inductor-level dielectric material layer is referred to as a fifth interconnect-level dielectric material layer 650. Generally, the inductor-level dielectric material layer (such as the fifth interconnect-level dielectric material layer 650) may comprise any material that may be used for the first, second, third and fourth interconnect-level dielectric material layers (610, 620, 630, 640). Inductor-level metal interconnect structures (652, 658) may be formed in the fifth interconnect-level dielectric material layer 650. The inductor-level metal interconnect structures (652, 658) comprise inductor-level metal line structures (which may be fifth metal line structures 658) and inductor-level metal via structures (which may be fourth metal via structures 652). The inductor-level metal line structures include an inductive metal line 40 that is an inductor structure. Generally, the inductor-level metal interconnect structures (652, 658) may be formed by forming via cavities and line cavities in the fifth interconnect-level dielectric material layer 650, and by filling the via cavities and the line cavities with at least one metallic fill material.

For example, a first photoresist layer (not shown) may be applied over the fifth interconnect-level dielectric material layer 650, and may be lithographically patterned to form a pattern of via openings. A first anisotropic etch process may be performed to transfer the pattern of via openings into an upper portion of the fifth interconnect-level dielectric material layer 650. In-process via cavities may be formed in the upper portion of the fifth interconnect-level dielectric material layer 650. The first photoresist layer may be removed, for example, by ashing. A second photoresist layer (not shown) may be applied over the fifth interconnect-level dielectric material layer 650, and may be lithographically patterned to form a pattern of line-shaped openings. The areas of the line-shaped openings may include the areas of the in-process via cavities. A second anisotropic etch process may be performed to transfer the pattern of the line-shaped openings into an upper portion of the fifth interconnect-level dielectric material layer 650 and to vertically extend the in-process via cavities. Integrated line-and-via cavities may be formed in the fifth interconnect-level dielectric material layer 650. Each integrated line-and-via cavity may include a line cavity that is formed in an upper portion of the fifth interconnect-level dielectric material layer 650 and at least one via cavity that extends from a horizontal bottom surface of the line cavity through a lower portion of the fifth interconnect-level dielectric material layer 650 down to a top surface of a respective one of the fourth metal line structures 648. The second photoresist layer may be removed, for example, by ashing.

At least one metallic material may be deposited in the integrated line-and-via cavities, and excess portions of the at least one metallic material may be removed from above the horizontal plane including the top surface of the fifth interconnect-level dielectric material layer 650. Each remaining portion of the at least one metallic material constitutes an integrated line and via structure that includes a respective fifth metal line structure 658 and at least one respective fourth metal via structure 652. In one embodiment, one of the integrated line and via structures may comprise a combination of an inductive line structure 40 and a pair of fourth metal via structures 652 that contact a top surface of a respective one of the fourth metal line structures 648.

While the present disclosure is described using an embodiment in which the fifth metal line structures 658 and the fourth metal via structures 652 are formed as integrated line and via structures through a dual damascene integration scheme, embodiments are expressly contemplated herein in which the fifth metal line structures 658 and the fourth metal via structures 652 are formed through different types of dual damascene integration schemes or through a single damascene integration scheme in which the capping dielectric material layer 653 are formed as two separate layers and the fourth metal via structures 652 and the fifth metal line structures 658 are formed using different metal deposition processes and metal planarization processes.

The inductive metal line 40 may be formed in a dielectric material layer (such as a fifth interconnect-level dielectric material layer 650) that overlies a semiconductor substrate 8 and laterally encloses an area A, which may be defined by innermost sidewalls of the inductive metal line 40 and a vertical plane located in a lateral gap of the inductive metal line 40 and connecting an innermost sidewall of the inductive metal line 40 to another innermost sidewall of the inductive metal line 40. In one embodiment, the inductive metal line 40 may comprise multiple loop segments that are interconnected to one another in a spiral configuration. In one embodiment, the inductive metal line 40 may comprise a single loop segment. In one embodiment, the inductive metal line 40 overlies metal interconnect structures (612, 618, 622, 628, 632, 638) that are embedded within the dielectric material layers (601, 610, 620, 630). The inductive metal line 40 may be electrically connected to a subset of such metal interconnect structures (612, 618, 622, 628, 632, 638), and laterally enclosing an area A. In one embodiment, the inductive metal line 40 may comprise a metallic fill material portion comprising, and/or consisting essentially of, Cu, Au, Ag, Al, W, Ti, Ta, Mo, Ru, or other metal fill materials.

Figure 4:
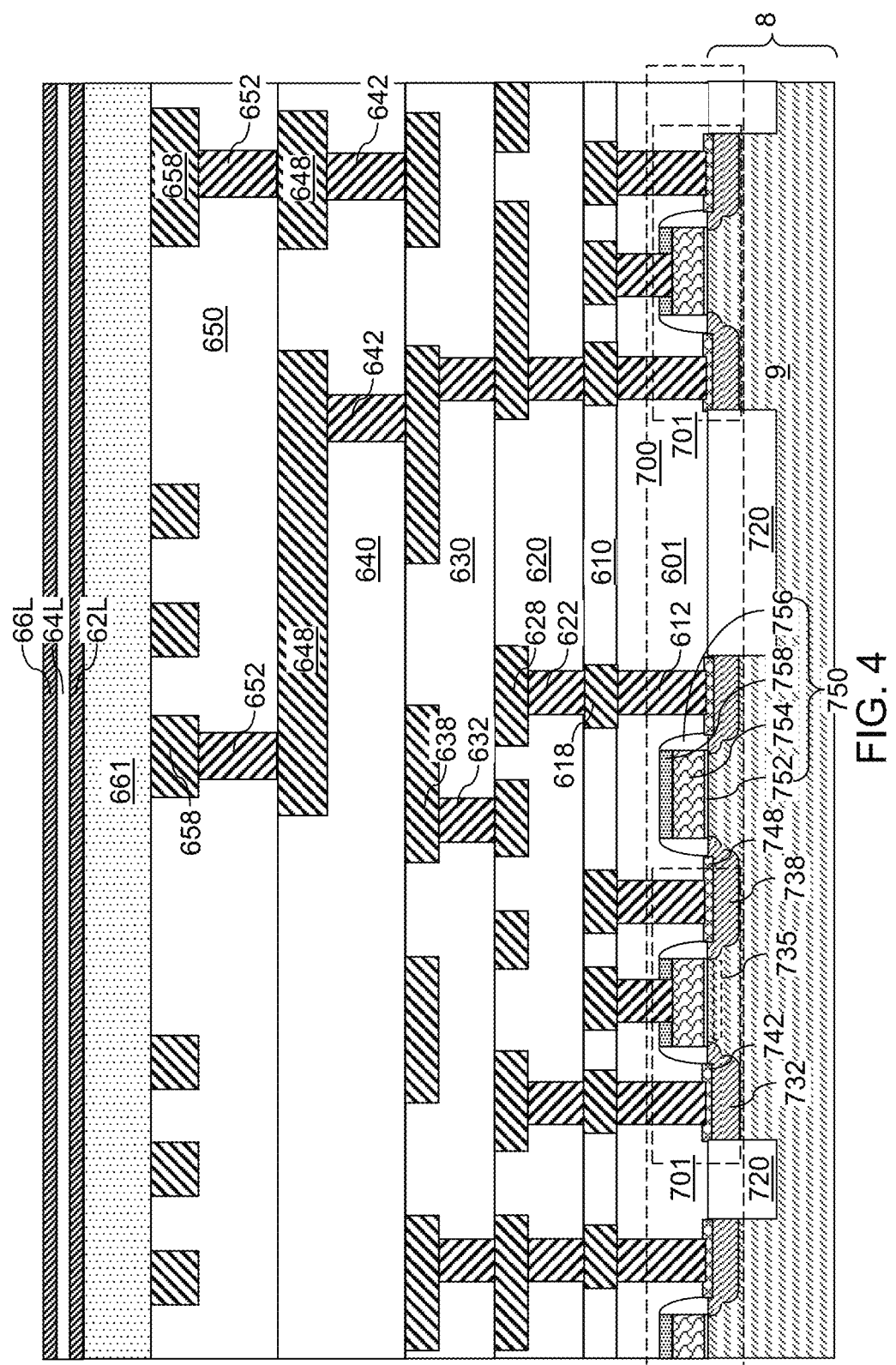
FIG. 4 is a vertical cross-sectional view of the first exemplary structure after formation of a base dielectric material layer and a layer stack containing a first ferromagnetic material layer, a nonmagnetic metallic layer, and a second ferromagnetic material layer according to an embodiment of the present disclosure.

Referring to FIG. 4, a base dielectric material layer 661 having a uniform thickness may be formed over the inductor-level dielectric material layer (such as the fifth interconnect-level dielectric material layer 650) and the inductive metal line 40. The base dielectric material layer 661 may include a dielectric material such as undoped silicate glass, a doped silicate glass, organosilicate glass, or a porous dielectric material, and may be deposited by chemical vapor deposition. The thickness of the base dielectric material layer 661 may be in a range from 20 nm to 300 nm, although lesser and greater thicknesses may also be used.

An upper layer stack containing a first upper ferromagnetic material layer 62L, an upper nonmagnetic metallic material layer 64L, and a second upper ferromagnetic material layer 66L may be formed over the base dielectric material layer 661. The first upper ferromagnetic material layer 62L may include a ferromagnetic material that is ferromagnetic at room temperature (i.e., 20 degrees Celsius) in a bulk form, and the second upper ferromagnetic material layer 66L may include another ferromagnetic material that is ferromagnetic at room temperature in a bulk form. Each of the first upper ferromagnetic material layer 62L and the second upper ferromagnetic material layer 66L may be independently and interchangeably referred to as a first ferromagnetic material layer or as a second ferromagnetic material layer in the claims of the instant application. Generally, ordinals are not a part of a name for an element represented by a reference numeral. The upper nonmagnetic metallic material layer 64L includes a nonmagnetic metallic material.

Each ferromagnetic material of the first upper ferromagnetic material layer 62L and the second upper ferromagnetic material layer 66L may be independently selected from ferromagnetic materials that each have a perpendicular magnetic anisotropy (PMA) in a thin film form, such as in a form of a film having a thickness less than 10 nm. Perpendicular magnetic anisotropy refers to a reduction of a total energy of a system upon alignment of a magnetization along a direction that is perpendicular to a surface of a thin film. For example, each ferromagnetic material of the first upper ferromagnetic material layer 62L and the second upper ferromagnetic material layer 66L may be independently selected from Fe, Co, Ni, NiFe, CoFe, NiCo, NiCoFe, compound rare earth-containing ferromagnetic materials, and ferromagnetic alloys thereof. Optionally, the ferromagnetic materials of the first upper ferromagnetic material layer 62L and the second upper ferromagnetic material layer 66L may be independently doped with a respective dopant element that may be selected from B, C, O, Ta, W, Zr, Pt, Mo, Mn, Ru, Mg, Hf, Ir, etc.

The first upper ferromagnetic material layer 62L may have a first thickness t1, and the second upper ferromagnetic material layer 66L may have a second thickness t2. According to an aspect of the present disclosure, each of the first upper ferromagnetic material layer 62L and the second upper ferromagnetic material layer 66L may be formed with a respective thickness that is less than 10 nm. In one embodiment, each of the first upper ferromagnetic material layer 62L and the second upper ferromagnetic material layer 66L may have a respective thickness in a range from 1 nm to 9.9 nm, such as from 2 nm to 6 nm. The limitation of the thicknesses of the first upper ferromagnetic material layer 62L and the second upper ferromagnetic material layer 66L below 10 nm has the effect of orienting the easy axis of magnetization of the ferromagnetic material along the vertical direction. Each of the first upper ferromagnetic material layer 62L and the second upper ferromagnetic material layer 66L may be formed, for example, by a respective physical vapor deposition process.

The nonmagnetic metallic material of the upper nonmagnetic metallic material layer 64L may be selected from Ta, Mo, W, Hf, Zr, Ru, Pt, Pd, or any other nonmagnetic transition metal element. The thickness of the upper nonmagnetic metallic material layer 64L may be in a range from 3 nm to 100 nm, such as from 10 nm to 30 nm, although lesser and greater thicknesses may also be used. The upper nonmagnetic metallic material layer 64L may be formed by chemical vapor deposition or physical vapor deposition. The upper nonmagnetic metallic material layer 64L may be prior to formation of the second upper ferromagnetic material layer 66L, and after formation of the first upper ferromagnetic material layer 62L such that the upper nonmagnetic metallic material layer 64L is in direct contact with each of the first upper ferromagnetic material layer 62L and the second upper ferromagnetic material layer 66L. It is noted that each of the first upper ferromagnetic material layer 62L and the second upper ferromagnetic material layer 66L may be interchangeably referred to as a first ferromagnetic material layer or a second ferromagnetic material layer in the claims of the instant application.

In some embodiments, the nonmagnetic metallic material of the upper nonmagnetic metallic material layer 64L may be selected such that the perpendicular magnetic anisotropy of the ferromagnetic material of the first upper ferromagnetic material layer 62L and the perpendicular magnetic anisotropy of the ferromagnetic material of the second upper ferromagnetic material layer 66L increase through magnetic coupling through the upper nonmagnetic metallic material layer 64L. In such an embodiment, the thickness of the upper nonmagnetic metallic material layer 64L may be selected such that the magnetization of the first upper ferromagnetic material layer 62L is ferromagnetically or antiferromagnetically coupled to the magnetization of the second upper ferromagnetic material layer 66L. In one embodiment, the magnetization of the first upper ferromagnetic material layer 62L and the magnetization of the second upper ferromagnetic material layer 66L may both point upward, or may both point downward. Alternatively, one of the magnetization of the first upper ferromagnetic material layer 62L and the magnetization of the second upper ferromagnetic material layer 66L may point upward, and another of the magnetization of the first upper ferromagnetic material layer 62L and the magnetization of the second upper ferromagnetic material layer 66L may point downward.

In another embodiment, the inductor structure may include at least one repetition of an additional upper nonmagnetic metallic material layer (not shown) and an additional upper ferromagnetic material layer (not shown). In this embodiment, each additional upper nonmagnetic metallic material layer may have the same thickness range as, and may have any material composition that is allowed for, the upper nonmagnetic metallic material layer 64L, and each additional upper ferromagnetic material layer may have the same thickness range as, and may have any material composition that is allowed for, the second upper ferromagnetic material layer 66L. In an example, a superlattice including a multiple repetition of a unit layer stack may be formed. The unit layer stack may include a ferromagnetic material layer and a nonmagnetic metallic material layer. The number of repetitions of the unit cell in the superlattice may be in a range from 2 to 10, although a greater number may also be used.

Figure 5A:
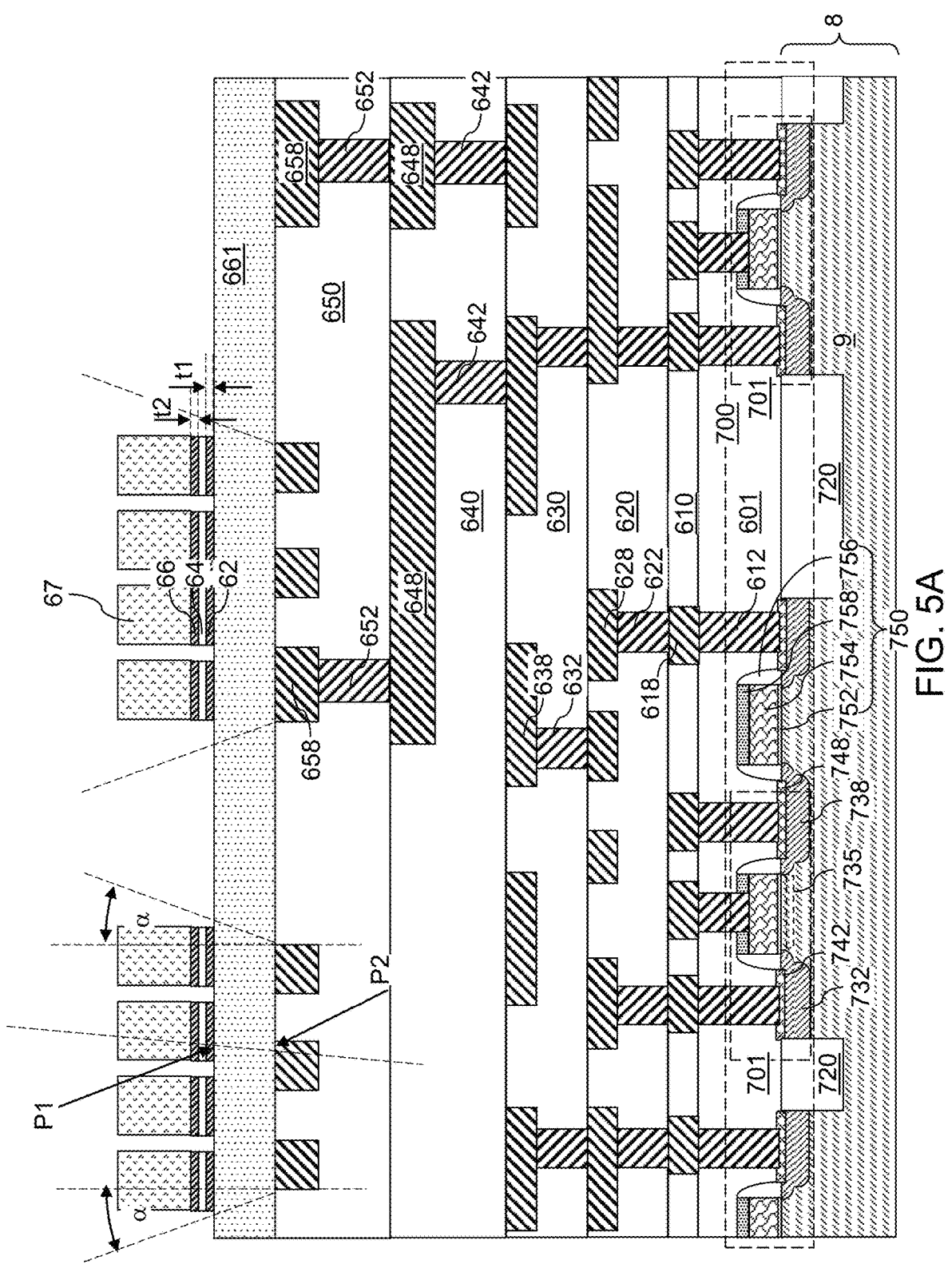
FIG. 5A is a vertical cross-sectional view of the first exemplary structure after patterning the layer stack into a stack of an array of first ferromagnetic plates, an array of nonmagnetic metallic plates, and an array of second ferromagnetic plates according to an embodiment of the present disclosure.
Figure 5B:
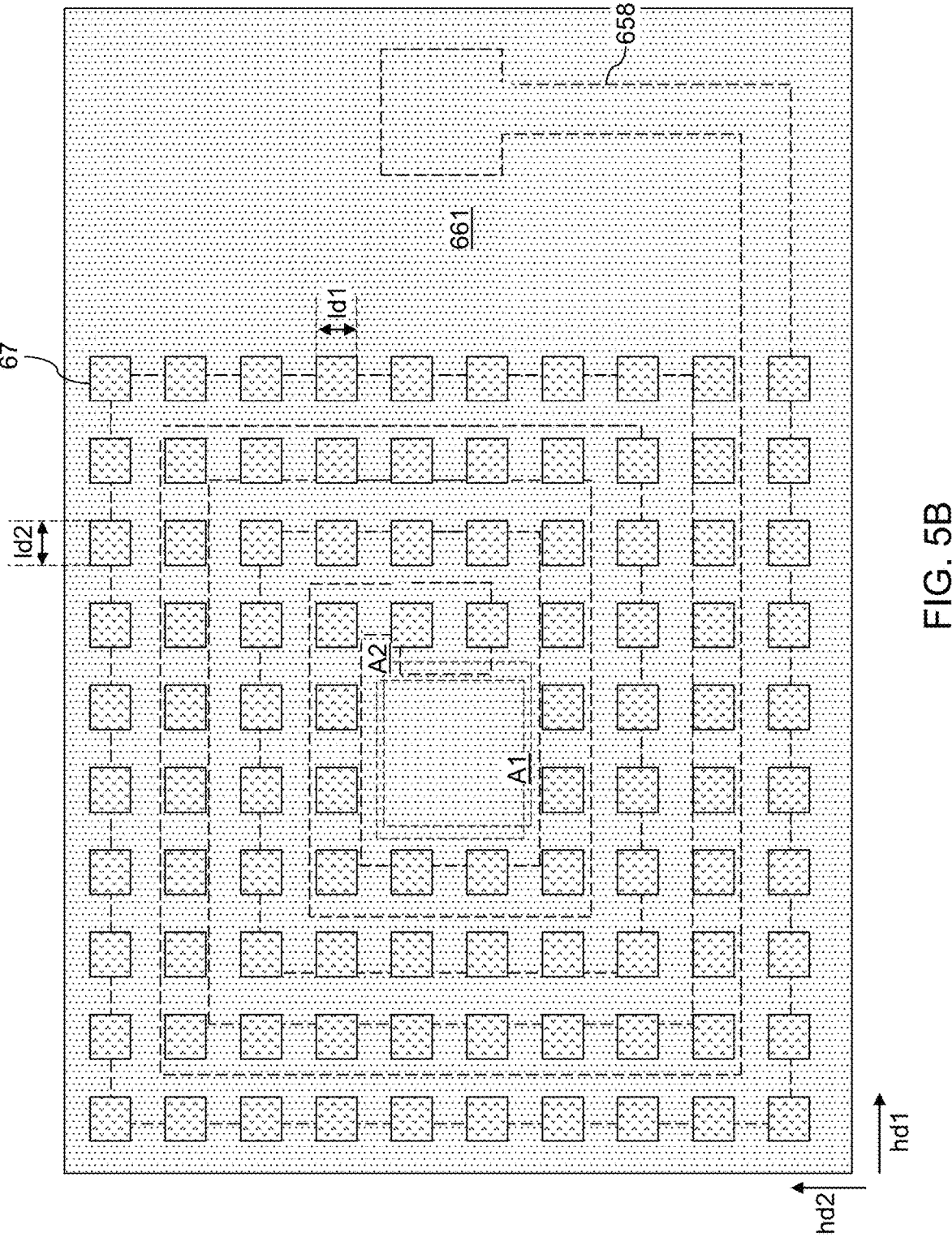
FIG. 5B is a top-down view of the first exemplary structure of FIG. 5A.
Figure 5C:
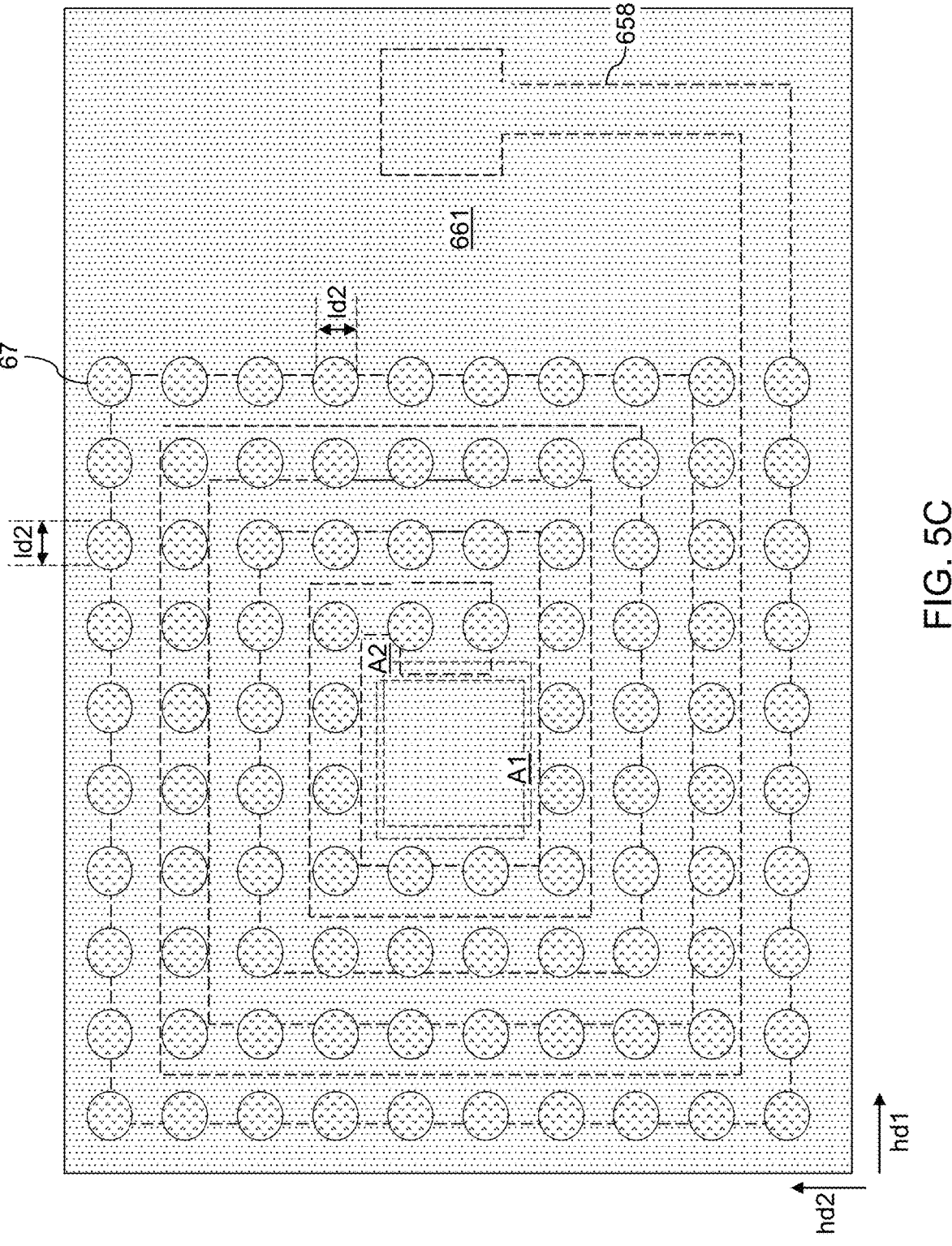
FIG. 5C is a top-down view of an alternative configuration of the first exemplary structure of FIG. 5A.

Referring to FIGS. 5A-5C, a photoresist layer 67 may be applied over the upper layer stack (62L, 64L, 66L), and may be lithographically patterned into a two-dimensional array of discrete photoresist material portions. In one embodiment, the two-dimensional array of discrete photoresist material portions may be a periodic two-dimensional array of discrete photoresist material portions having a first pitch along the first horizontal direction hd1 and having a second pitch along the second horizontal direction. Each of the discrete photoresist material portions may have a first lateral dimension ld1 along the first horizontal direction hd1, and a second lateral dimension ld2 along the second horizontal direction hd2. Each of the discrete photoresist material portions may have a respective horizontal cross-sectional shape, which may be a shape of a square as illustrated in FIG. 5B, a shape of a circle as illustrated in FIG. 5C, or a shape of a rectangle, a rounded rectangle, an oval, or any two-dimensional shape having a closed periphery.

According to an aspect of the present disclosure, the first lateral dimension ld1 and the second lateral dimension ld2 of each of the discrete photoresist material portions may be in a range from 10 nm to 200 nm, such as from 20 nm to 100 nm. According to an aspect of the present disclosure, the discrete photoresist material portions may be formed within areas having an areal overlap with the inductive metal line 40, or within areas located in an immediate vicinity of such areas. In one embodiment, each of the discrete photoresist material portions may have at least partial areal overlap with the inductive metal line 40. In one embodiment, an area in which the discrete photoresist material portions are absent may be provided within the first area A1 enclosed by the inducive metal line 40. Further, the discrete photoresist material portions are absent in an area that laterally encloses the inductive metal line 40. In other words, the discrete photoresist material portions are formed only in areas that overlap with the inductive metal line 40 or in areas that are proximal to such overlapping areas. (See e.g., FIGS. 5B and 5C).

An anisotropic etch process may be performed to transfer the pattern of the discrete photoresist material portions through the upper layer stack (62L, 64L, 66L). The patterned photoresist layer may be used as the etch mask for the anisotropic etch process. A terminal etch step of the anisotropic etch process that etches through the first upper ferromagnetic material layer 62L may be selective to the material of the base dielectric material layer 661. The second upper ferromagnetic material layer 66L may be divided into a two-dimensional array of second upper ferromagnetic plates 66. The upper nonmagnetic metallic material layer 64L may be divided into a two-dimensional array of upper nonmagnetic metallic plates 64. The first upper ferromagnetic material layer 62L may be divided into a two-dimensional array of first upper ferromagnetic plates 62. The patterned photoresist layer may be subsequently removed, for example, by ashing.

In one embodiment, each of the upper nonmagnetic metallic plates 64 may have a same horizontal cross-sectional shape as an overlying second upper ferromagnetic plate 66 and as an underlying first upper ferromagnetic plate 62. In one embodiment, each sidewall of a upper nonmagnetic metallic plate 64 may be vertically coincident with a sidewall of an overlying second upper ferromagnetic plate 66 and with a sidewall of an underlying first upper ferromagnetic plate 62. In one embodiment, each of the first upper ferromagnetic plates 62, the upper nonmagnetic metallic plates 64, and the second upper ferromagnetic plates 66 may have a maximum lateral dimension in a range from 10 nm to 200 nm, such as from 20 nm to 100 nm. In one embodiment, each first upper ferromagnetic plate 62 within the array of first upper ferromagnetic plates 62 has a maximum vertical dimension less than 10 nm. In one embodiment, each second upper ferromagnetic plate 66 within the array of second upper ferromagnetic plates 66 has a maximum vertical dimension less than 10 nm.

In one embodiment, each of the first upper ferromagnetic plates 62 comprises a ferromagnetic material that is ferromagnetic at room temperature, and each of the second upper ferromagnetic plates 66 comprises another ferromagnetic material that is ferromagnetic at room temperature. The coverage ratio of the second upper ferromagnetic plates 66, as defined by the ratio of the sum of the areas of the second upper ferromagnetic plates 66 relative to the area of a region including the second upper ferromagnetic plates 66, may be in a range from 0.10 to 0.90, such as from 0.15 to 0.80 and/or from 0.20 to 0.70, although lesser and greater coverage ratios may also be used.

In one embodiment, an array of upper nonmagnetic metallic plates 64 may be in contact with the array of first upper ferromagnetic plates 62 and the array of second ferromagnetic particles 66. In one embodiment, each of the upper nonmagnetic metallic plates 64 may have a same areas a respective underlying first upper ferromagnetic plate 62 within the array of first upper ferromagnetic plates 62, and may have same areas a respective overlying second upper ferromagnetic plate 66 within the array of second upper ferromagnetic plates 66.

Generally, the inductive metal line 40 may be located in a dielectric material layer (which may comprise any interconnect-level dielectric material layer such as a fifth interconnect-level dielectric material layer 650) that overlies a semiconductor substrate 8 and laterally encloses a first area A1. An array of first upper ferromagnetic plates 62 comprising a first upper ferromagnetic material may overlie the inductive metal line 40. According to an aspect of the present disclosure, the inductive metal line 40 and the array of first upper ferromagnetic plates 62 may be formed in a geometry in which, for any first point P1 that is selected within volumes of the first upper ferromagnetic plates 62, a respective second point P2 exists within a horizontal surface of the inductive metal line 40 such that a line connecting the first point P1 and the second point P2 is vertical or has a respective first taper angle that is less than 20 degrees with respective to a vertical direction. For example, a volume may be defined from an inductive metal line 40 such that the volume is located above the horizontal plane including the top surface of the inductive metal line 40, and is laterally enclosed by a set of tilted planes that pass through a respective edge of the top surface of the inductive metal line 40 and are tilted outward along an upward direction with a tilt angle α of 20 degrees. The entirety of the first upper ferromagnetic plates 62 and the second upper ferromagnetic plates 66 may be located in the volume thus defined.

Formation of the first upper ferromagnetic plates 62 and the second upper ferromagnetic plates 66 within this volume provides the benefit of ensuring that magnetic field generated by the inductive metal line 40 is horizontal or substantially horizontal. In one embodiment, the magnetic field generated by the inductive metal line 40 may be along a respective direction at each point within the first upper ferromagnetic plates 62 and the second upper ferromagnetic plates 66 that does not deviate from the horizontal direction by more than 20 degrees. Thus, a predominant component of the magnetic field is horizontal at each point within the first upper ferromagnetic plates 62 and the second upper ferromagnetic plates 66, and thus, is applied along a direction of a hard axis of magnetization, i.e., along a direction in which magnetic alignment of the magnetization of the ferromagnetic materials of the first upper ferromagnetic plates 62 and the second upper ferromagnetic plates 66 do not align easily. Generally, the inductive metal line 40 may comprise multiple loop segments that are interconnected among one another in a spiral configuration, or may comprise a single loop segment.

In one embodiment, the array of first upper ferromagnetic plates 62 laterally encloses a second area A2 that has a partial overlap with the first area A1 in a plan view, and is free of any ferromagnetic material. In one embodiment, each of the first upper ferromagnetic plates 62 is located such that any magnetic field generated by an electrical current passing through the inductive metal line 40 and passing through any of the first upper ferromagnetic plates 62 has a greater horizontal magnetic field strength than a vertical magnetic field strength. In one embodiment, each of the first upper ferromagnetic plates 62 has a respective maximum lateral dimension that is greater than twice a vertical dimension of the first upper ferromagnetic plates 62.

In one embodiment, each first upper ferromagnetic plate 62 within the array of first upper ferromagnetic plates 62 has a maximum vertical dimension less than 10 nm. In one embodiment, each first upper ferromagnetic plate 62 within the array of first upper ferromagnetic plates 62 has a maximum lateral dimension in a range from 10 nm to 200 nm.

In one embodiment, a ratio of an overlap area between the inductive metal line 40 and the array of first upper ferromagnetic plates 62 in a plan view to a total area of the inductive metal line 40 in the plan view is in a range from 0.10 to 0.90. An array of nonmagnetic metallic plates 64 may be in contact with the array of first upper ferromagnetic plates 62. Each of the nonmagnetic metallic plates 64 has a same areas as a respective overlying or underlying first upper ferromagnetic plate 62 within the array of first upper ferromagnetic plates 62. In one embodiment, an array of second upper ferromagnetic plates 66 may be in contact with the array of nonmagnetic metallic plates 64. The array of second upper ferromagnetic plates 66 comprises a second upper ferromagnetic material.

The array of nonmagnetic metallic plates 64 may be in contact with the array of first upper ferromagnetic plates 62. Each of the nonmagnetic metallic plates 64 has a same areas as a respective overlying or underlying first upper ferromagnetic plate 62 within the array of first upper ferromagnetic plates 62.

The ferromagnetic plates (62, 66) of the present disclosure may increase the inductance of the inductor structure of the present disclosure by providing a high permeability material within the paths of the magnetic field generated by the inductive metal line 40. The total area of the inductor structure may be decreased due to the increase in the effective permeability of the materials around the inductive metal line 40. The perpendicular magnetic anisotropy (PMA) energy of the ferromagnetic materials in the ferromagnetic plates (62, 66) hinder alignment of the magnetic moments of the ferromagnetic materials in the ferromagnetic plates (62, 66) along horizontal directions, and thus, reduces or eliminates hysteresis effect and energy loss, and increases the Q factor of the inductor structure of the present disclosure. Further, the saturation field for the ferromagnetic materials of the ferromagnetic plates (62, 66) along horizontal directions is much larger than the saturation field along the vertical direction. Thus, the inductor structure of the present disclosure may use magnetic fields having a much greater magnetic field strength than any structure using ferromagnetic materials having an easy axis of magnetization along a horizontal direction.

Figure 6:
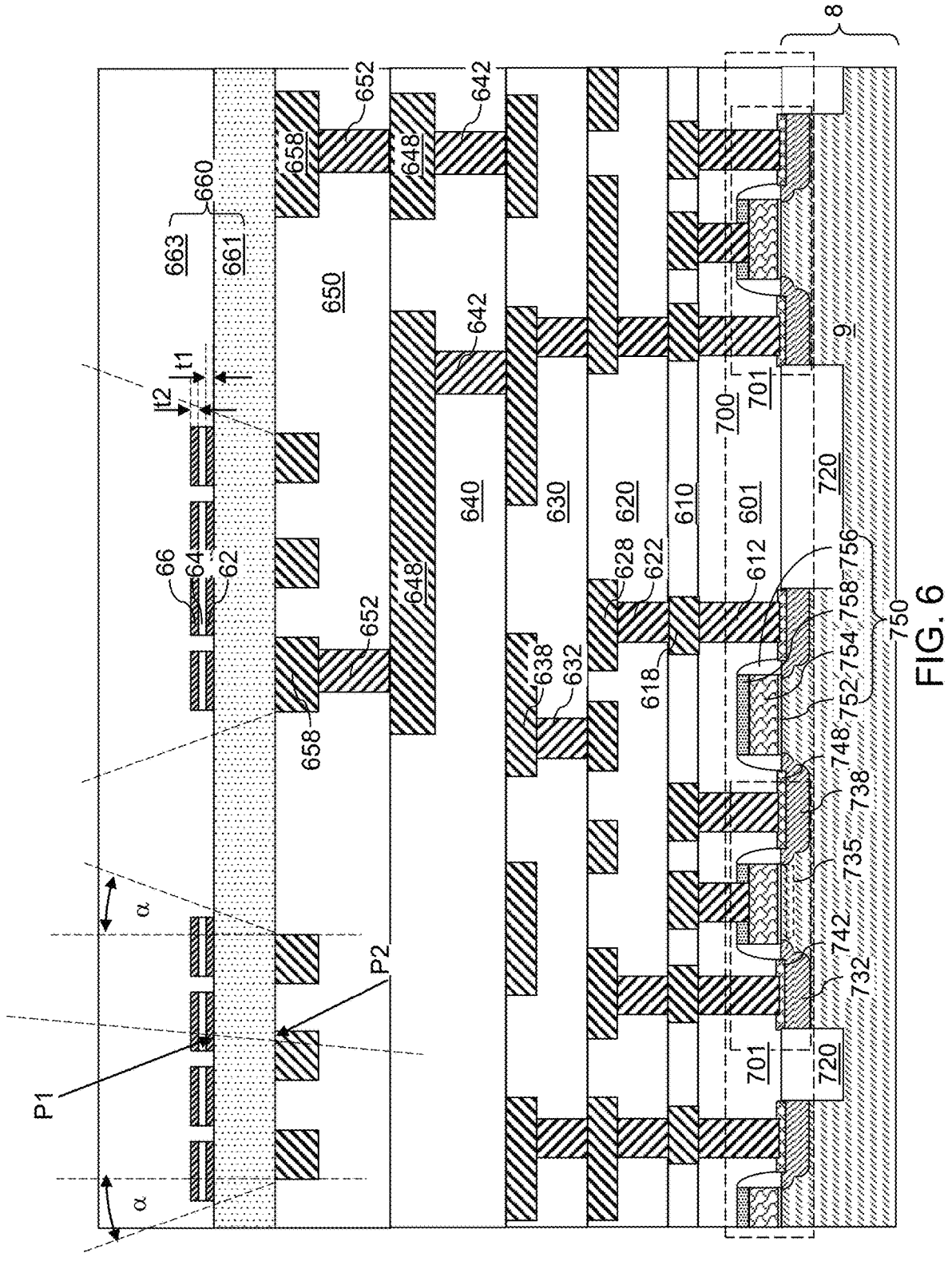
FIG. 6 is a vertical cross-sectional view of the first exemplary structure after formation of an over-inductor-level insulating layer according to an embodiment of the present disclosure.

Referring to FIG. 6, a capping dielectric material layer 663 may be deposited over the array of plates (62, 64, 66) and the base dielectric material layer 661. The combination of the base dielectric material layer 661 and the capping dielectric material layer 663 constitutes an interconnect-level dielectric material layer, which is herein referred to as a sixth interconnect-level dielectric material layer 660. Generally, the sixth interconnect-level dielectric material layer 660 may comprise any material that may be used for the first, second, third, fourth and fifth interconnect-level dielectric material layers (610, 620, 630, 640, 650).

Sixth metal line structures (not shown) and fifth metal via structures (not shown) may be formed in the sixth interconnect-level dielectric material layer 660. Additional interconnect-level dielectric material layers (not shown) and additional metal interconnect structures (not shown) and/or metallic bonding pads (not shown) may be formed above the sixth interconnect-level dielectric material layer 660 as needed.

Figure 7:
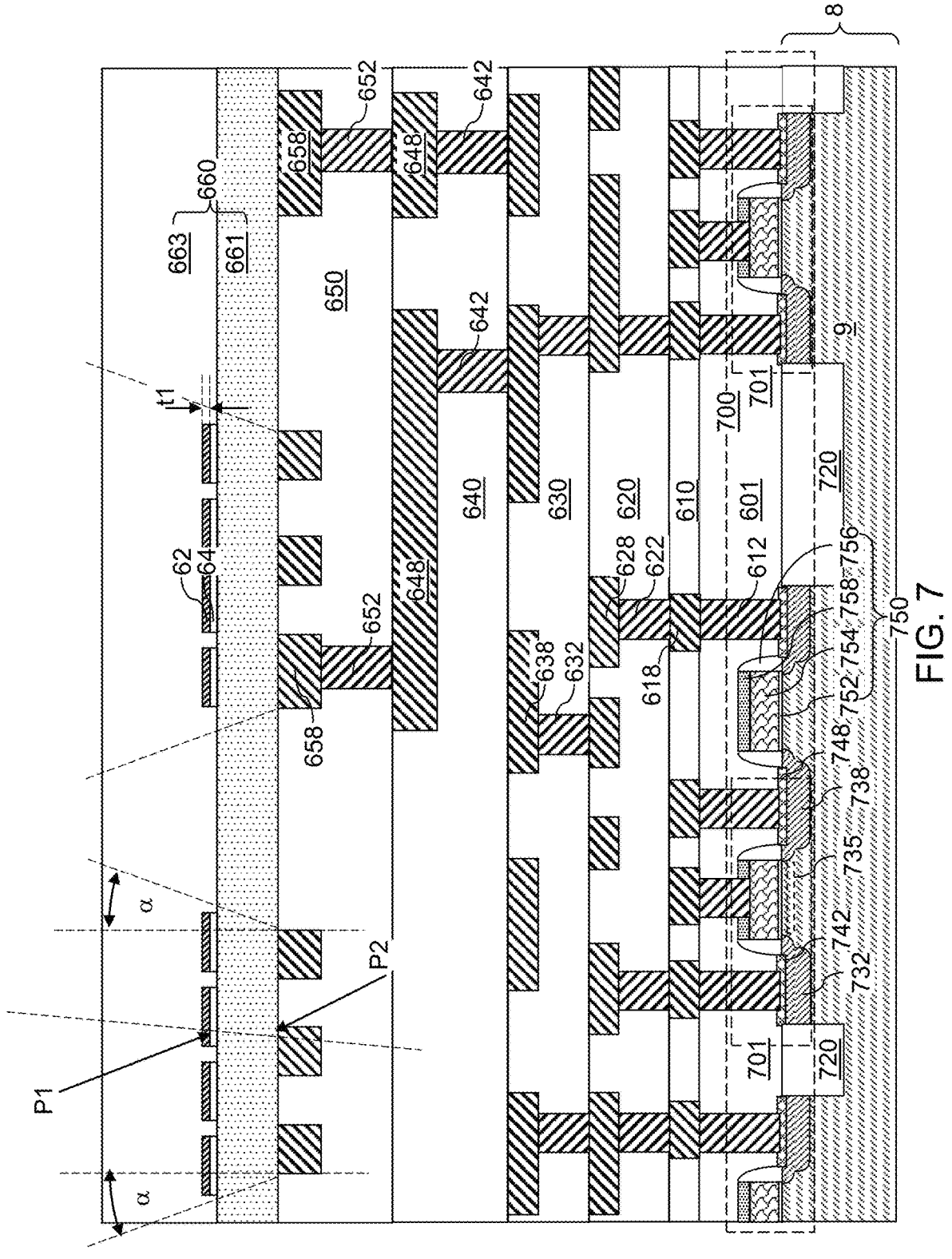
FIG. 7 is a vertical cross-sectional view of a first alternative configuration of the first exemplary structure according to an embodiment of the present disclosure.

Referring to FIG. 7, a first alternative configuration of the first exemplary structure may be derived from the first exemplary structure illustrated in FIG. 6 by omitting formation of the array of second upper ferromagnetic plates 66, and by forming the array of first upper ferromagnetic plates 62 above the array of upper nonmagnetic metallic plates 64.

As discussed above, the inductive metal line 40 and the array of first upper ferromagnetic plates 62 may be formed in a geometry in which, for any first point P1 that is selected within volumes of the first upper ferromagnetic plates 62, a respective second point P2 exists within a horizontal surface of the inductive metal line 40 such that a line connecting the first point P1 and the second point P2 is vertical or has a respective first taper angle that is less than 20 degrees with respective to a vertical direction. For example, a volume may be defined from an inductive metal line 40 such that the volume is located above the horizontal plane including the top surface of the inductive metal line 40, and is laterally enclosed by a set of tilted planes that pass through a respective edge of the top surface of the inductive metal line 40 and are tilted outward along an upward direction with a tilt angle α of 20 degrees. In this alternative embodiment, the entirety of the first upper ferromagnetic plates 62 may be located in the volume thus defined.

Figure 8:
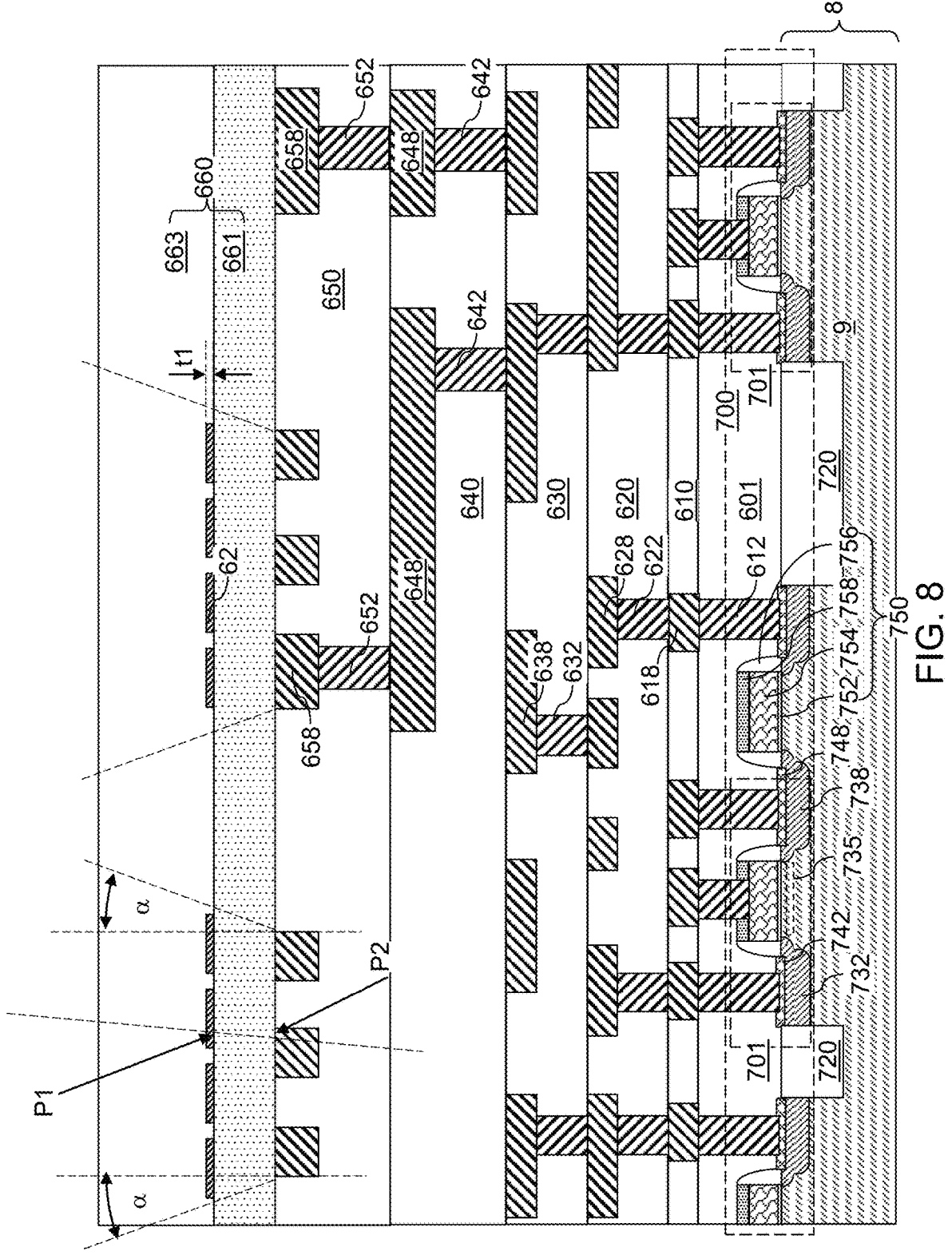
FIG. 8 is a vertical cross-sectional view of a second alternative configuration of the first exemplary structure according to an embodiment of the present disclosure.

Referring to FIG. 8, a second alternative configuration of the first exemplary structure may be derived from the first exemplary structure illustrated in FIG. 6 by omitting formation of the array of second upper ferromagnetic plates 66, and by omitting formation of the array of upper nonmagnetic metallic plates 64.

As discussed above, the inductive metal line 40 and the array of first upper ferromagnetic plates 62 are formed in a geometry in which, for any first point P1 that is selected within volumes of the first upper ferromagnetic plates 62, a respective second point P2 exists within a horizontal surface of the inductive metal line 40 such that a line connecting the first point P1 and the second point P2 is vertical or has a respective first taper angle that is less than 20 degrees with respective to a vertical direction. For example, a volume may be defined from an inductive metal line 40 such that the volume is located above the horizontal plane including the top surface of the inductive metal line 40, and is laterally enclosed by a set of tilted planes that pass through a respective edge of the top surface of the inductive metal line 40 and are tilted outward along an upward direction with a tilt angle α of 20 degrees. In this alternative embodiment, the entirety of the first upper ferromagnetic plates 62 may be located in the volume thus defined.

Figure 9A:
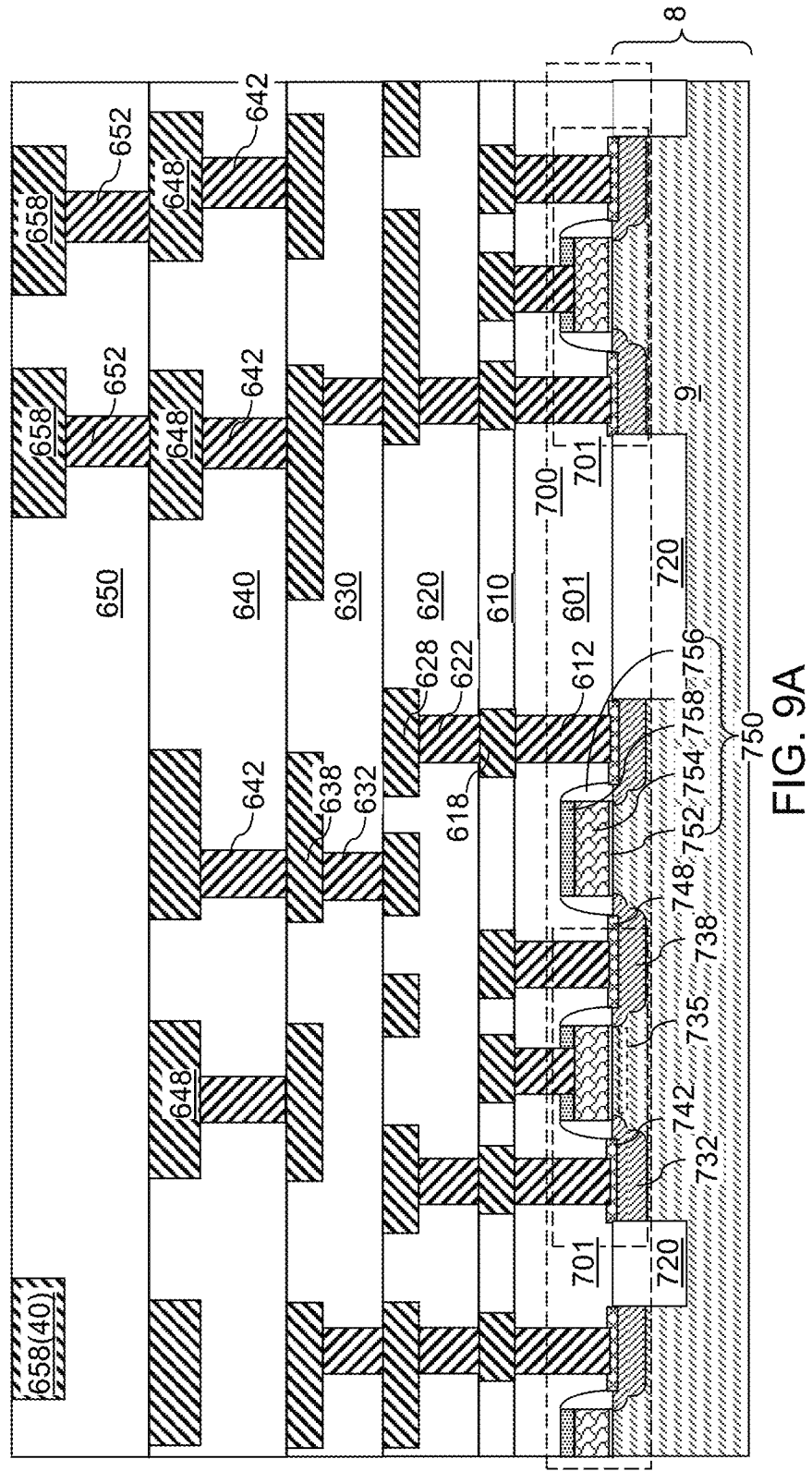
FIG. 9A is a vertical cross-sectional view of a second exemplary structure after formation of an inductive metal line and inductor-level metal interconnect structures according to an embodiment of the present disclosure.
Figure 9B:
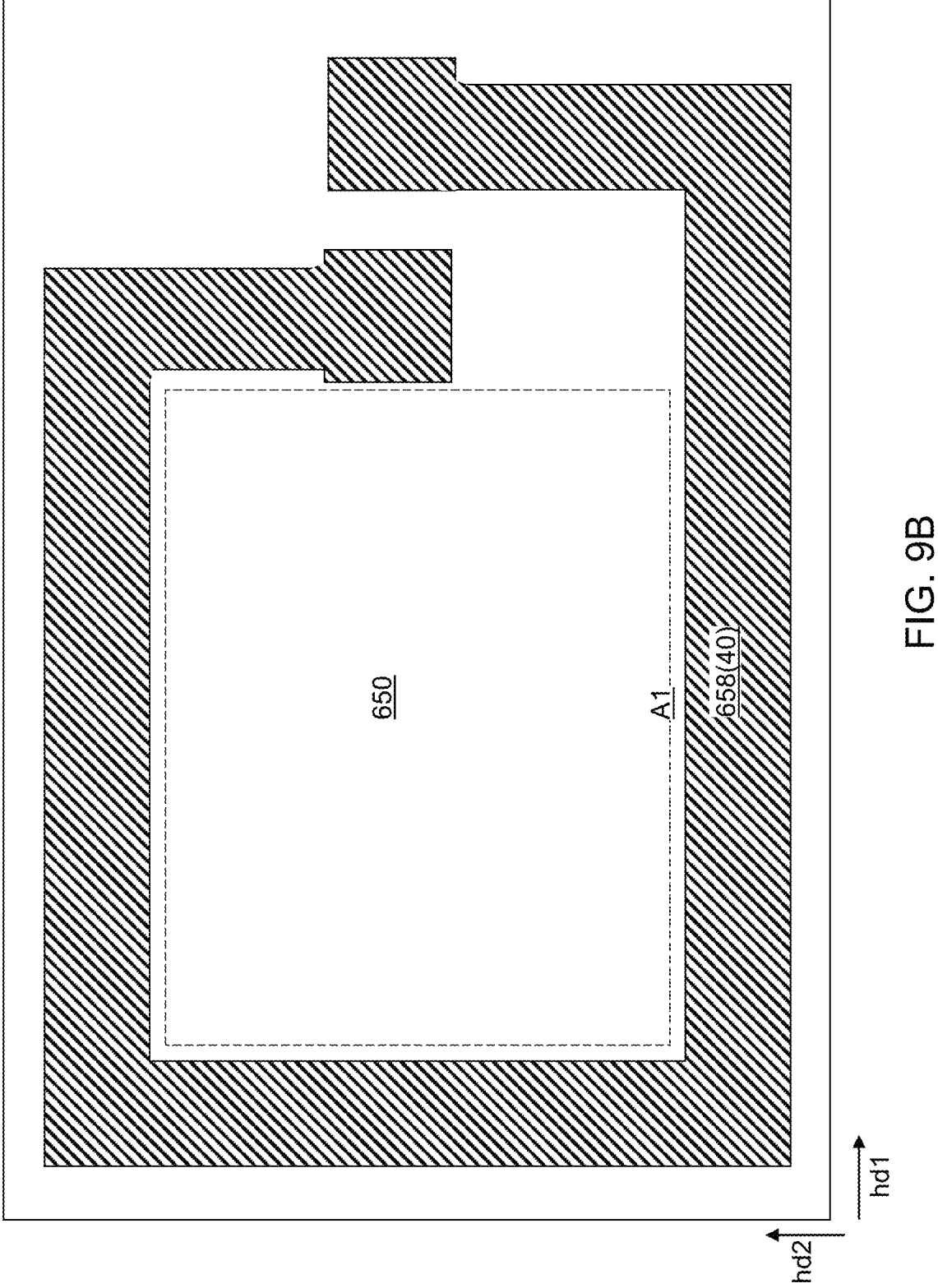
FIG. 9B is a top-down view of the second exemplary structure of FIG. 9A.
Figure 9C:
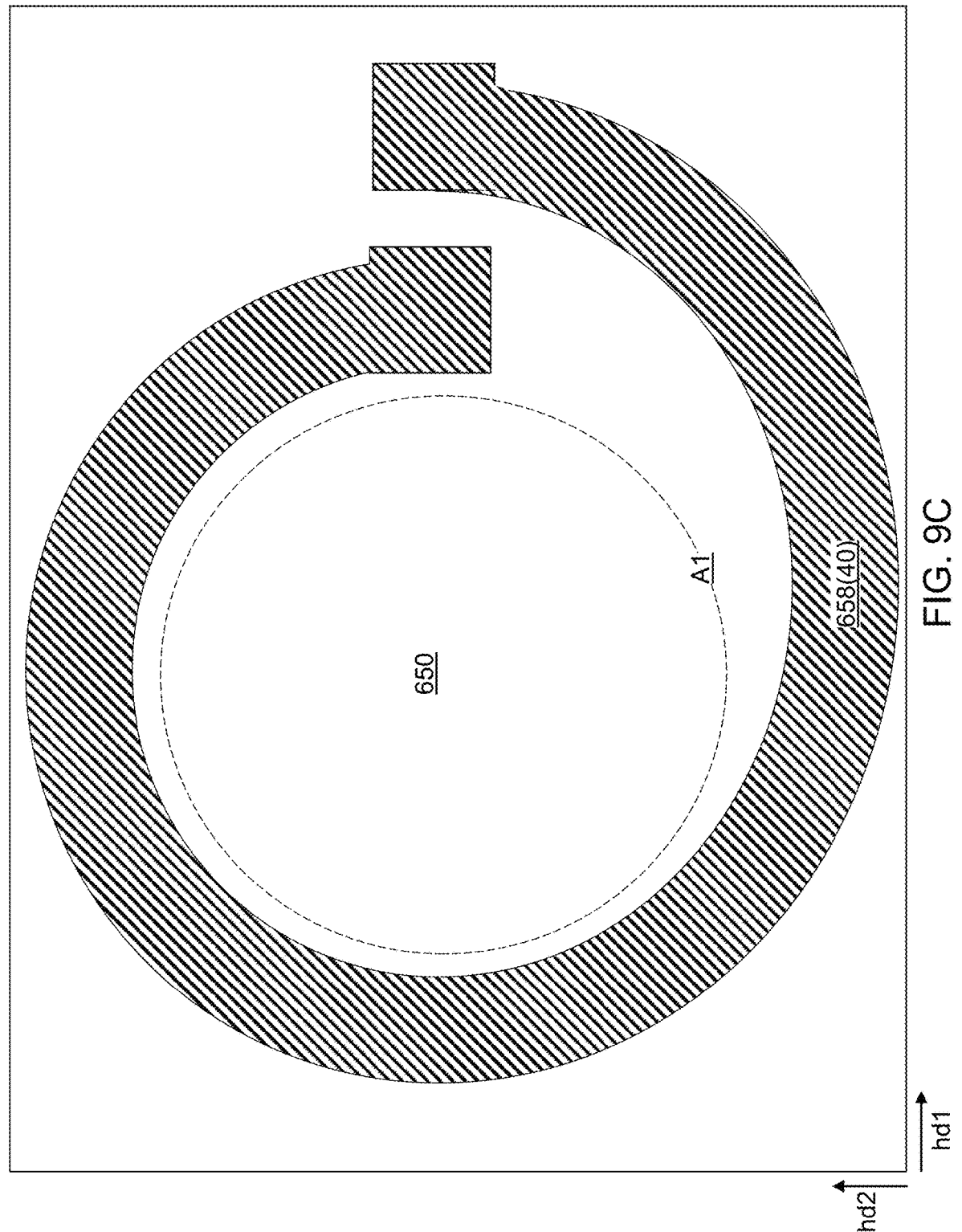
FIG. 9C is a top-down view of an alternative configuration of the second exemplary structure of FIG. 9A.

Referring to FIGS. 9A-9C, a second exemplary structure according to an embodiment of the present disclosure may be derived from the first exemplary structure illustrated in FIGS. 3A and 3B by changing the pattern of the inductive metal line 40. In this embodiment, the inductive metal line 40 may be formed in the configuration of a single loop. The single loop may have straight metal line segments that are adjoined to one another to provide a rectangular configuration as illustrated in FIG. 9B, or may have a curved line segment such as a circular line segment as illustrated in FIG. 9C.

Figure 10A:
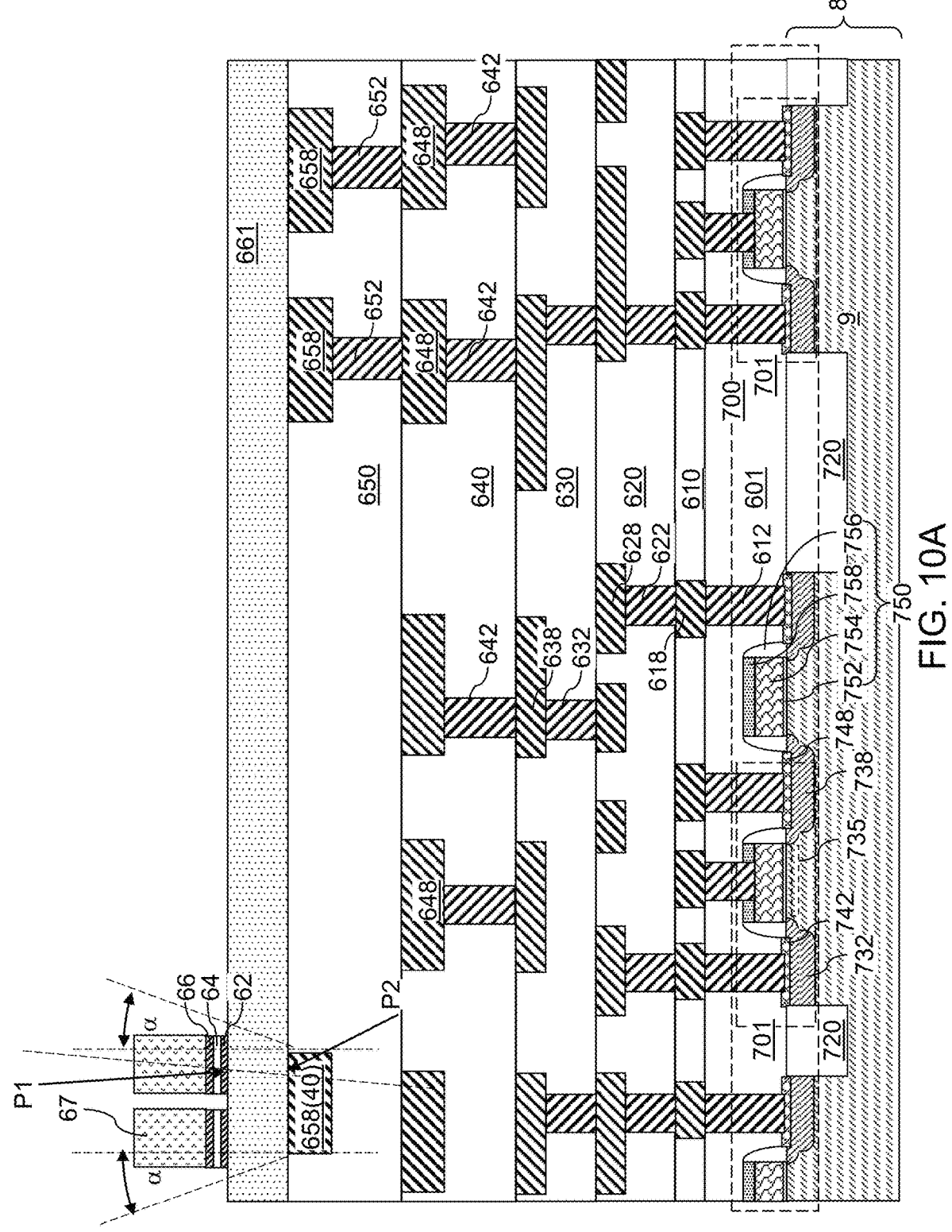
FIG. 10A is a vertical cross-sectional view of the second exemplary structure after formation of an array of first ferromagnetic plates, an array of nonmagnetic metallic plates, and an array of second ferromagnetic plates according to an embodiment of the present disclosure.
Figure 10B:
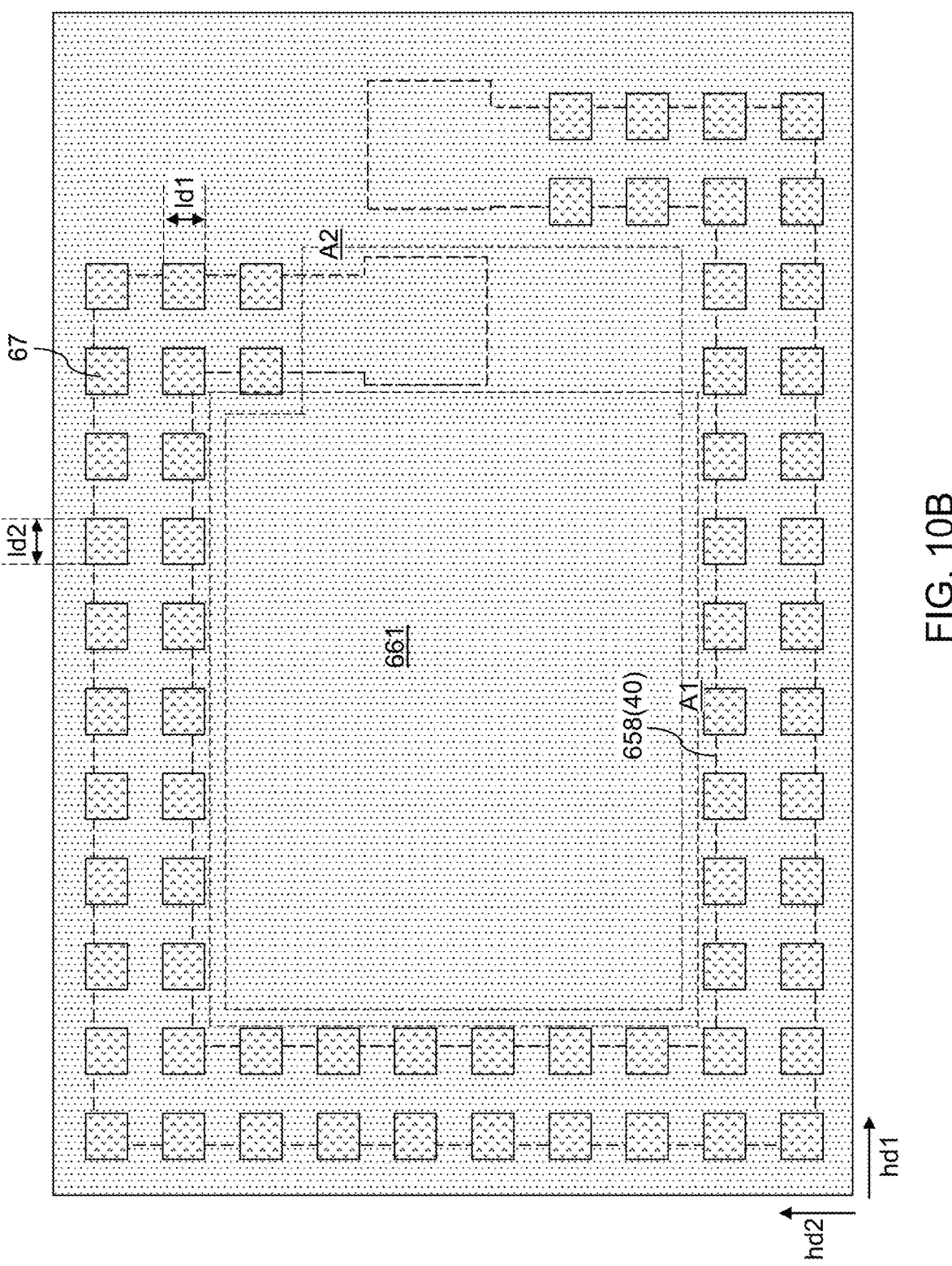
FIG. 10B is a top-down view of the second exemplary structure of FIG. 10A.
Figure 10C:
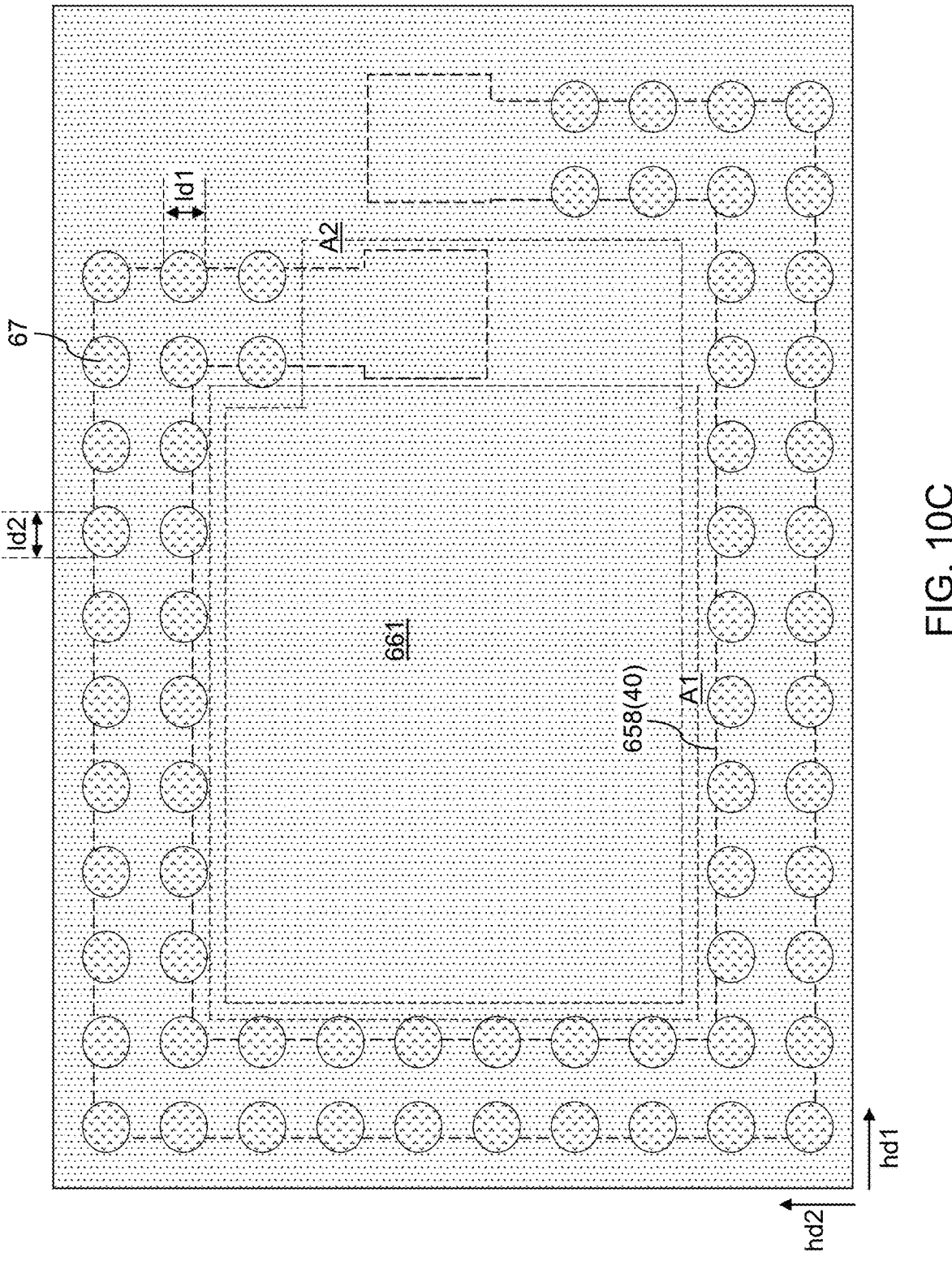
FIG. 10C is a top-down view of an alternative configuration of the second exemplary structure of FIG. 10A.

Referring to FIGS. 10A-10C, the processing steps of FIGS. 4 and 5A-5C may be performed to form an array of first upper ferromagnetic plates 62, an array of upper nonmagnetic metallic plates 64, and an array of second upper ferromagnetic plates 66. The pattern of the array of first upper ferromagnetic plates 62, the array of upper nonmagnetic metallic plates 64, and the array of second upper ferromagnetic plates 66 may be modified relative to the pattern illustrated in FIGS. 5A-5C in view of the change in the pattern of the inductive metal line 40.

As discussed above, the inductive metal line 40 and the array of first upper ferromagnetic plates 62 are formed in a geometry in which, for any first point P1 that is selected within volumes of the first upper ferromagnetic plates 62, a respective second point P2 exists within a horizontal surface of the inductive metal line 40 such that a line connecting the first point P1 and the second point P2 is vertical or has a respective first taper angle that is less than 20 degrees with respective to a vertical direction. For example, a volume may be defined from an inductive metal line 40 such that the volume is located above the horizontal plane including the top surface of the inductive metal line 40, and is laterally enclosed by a set of tilted planes that pass through a respective edge of the top surface of the inductive metal line 40 and are tilted outward along an upward direction with a tilt angle α of 20 degrees. The entirety of the first upper ferromagnetic plates 62 and the second upper ferromagnetic plates 66 may be located in the volume thus defined.

Figure 11:
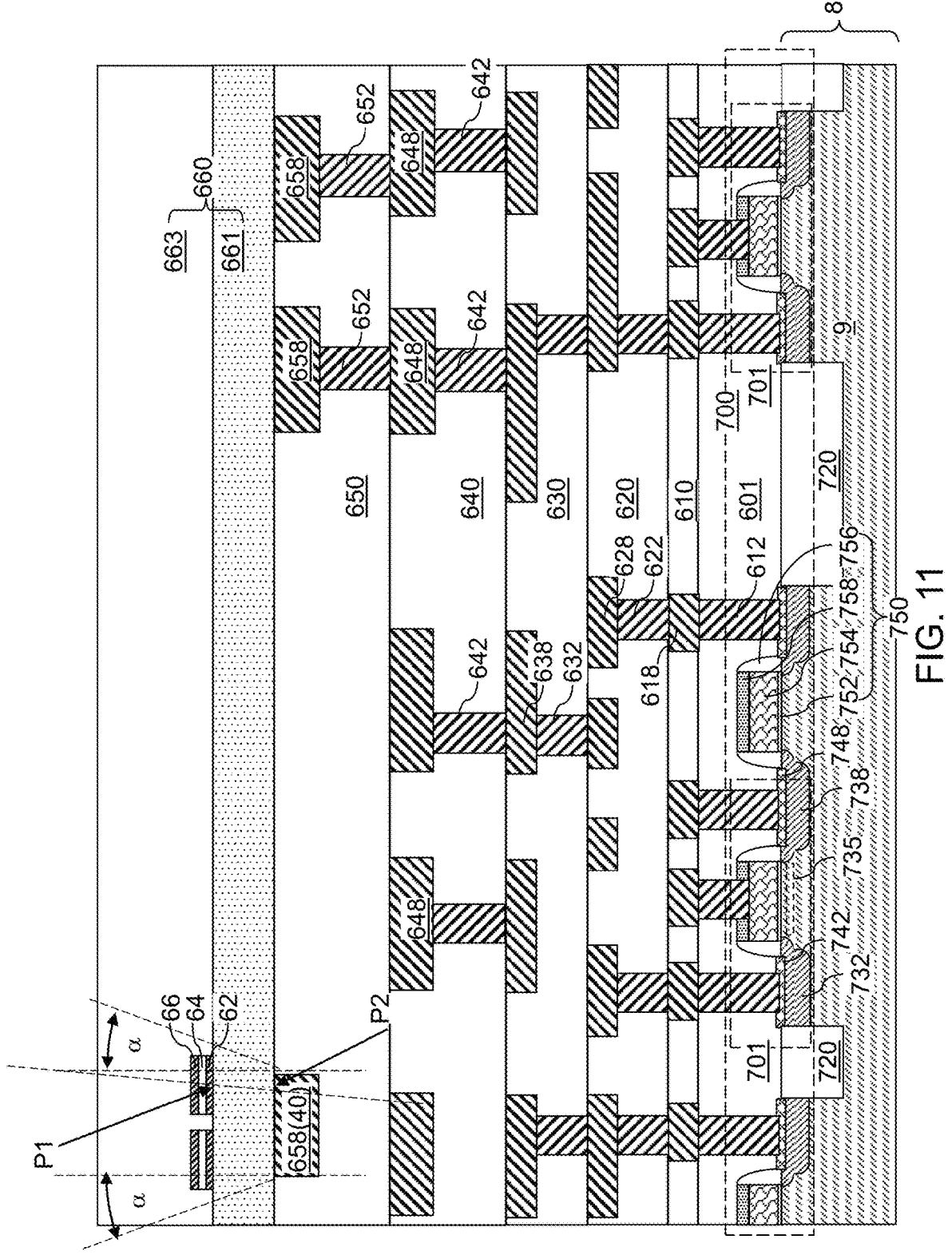
FIG. 11 is a vertical cross-sectional view of the second exemplary structure after formation of an over-inductor-level insulating layer according to an embodiment of the present disclosure.

Referring to FIG. 11, the processing steps of FIG. 6 may be performed to form a sixth interconnect-level dielectric material layer 660, sixth metal line structures (not shown), fifth metal via structures (not shown), and optionally additional interconnect-level dielectric material layers (not shown) and additional metal interconnect structures (not shown) and/or metallic bonding pads (not shown).

Figure 12:
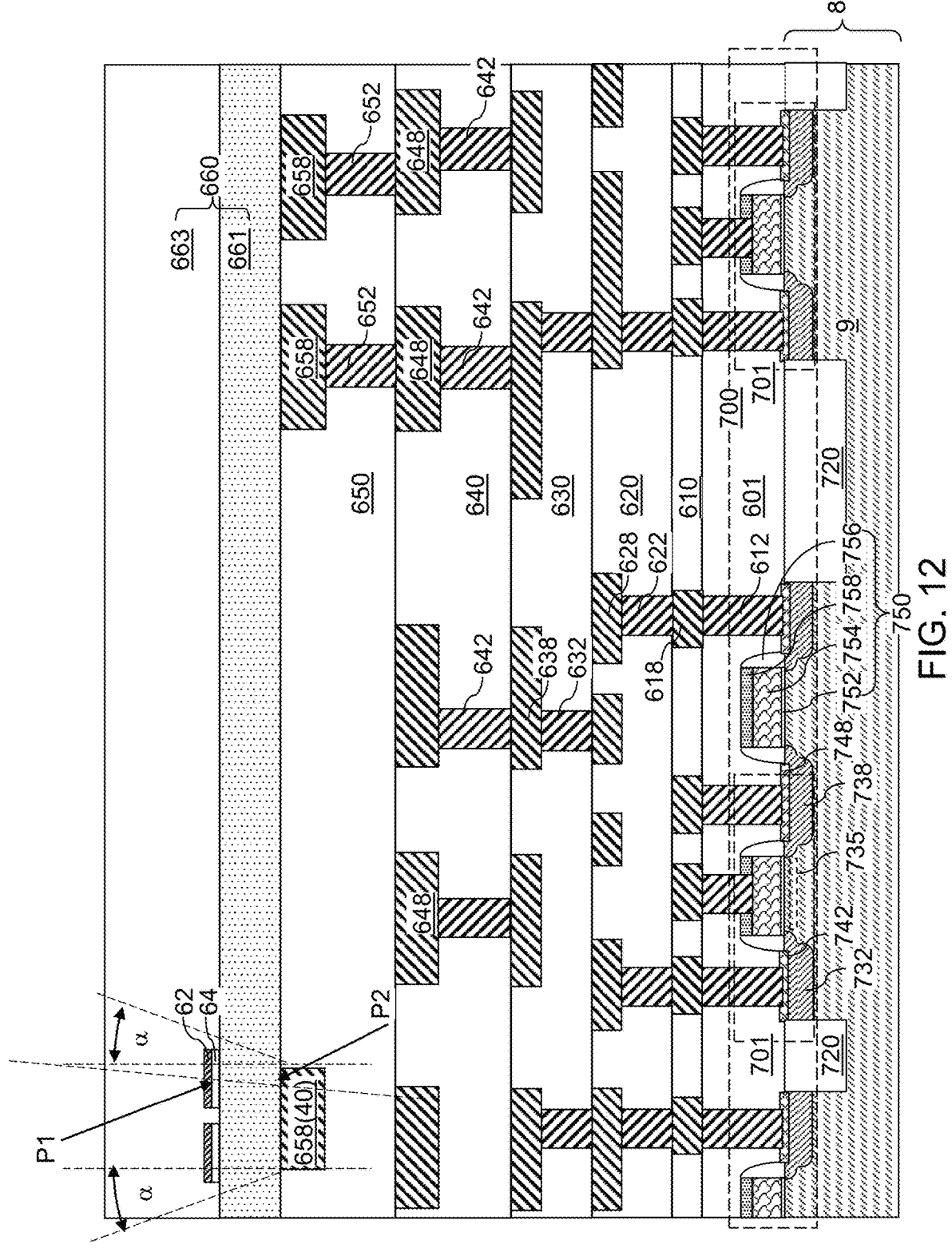
FIG. 12 is a vertical cross-sectional view of a first alternative configuration of the second exemplary structure according to an embodiment of the present disclosure.

Referring to FIG. 12, a first alternative configuration of the second exemplary structure may be derived from the second exemplary structure illustrated in FIG. 11 by omitting formation of the array of second upper ferromagnetic plates 66, and by forming the array of first upper ferromagnetic plates 62 above the array of upper nonmagnetic metallic plates 64.

Figure 13:
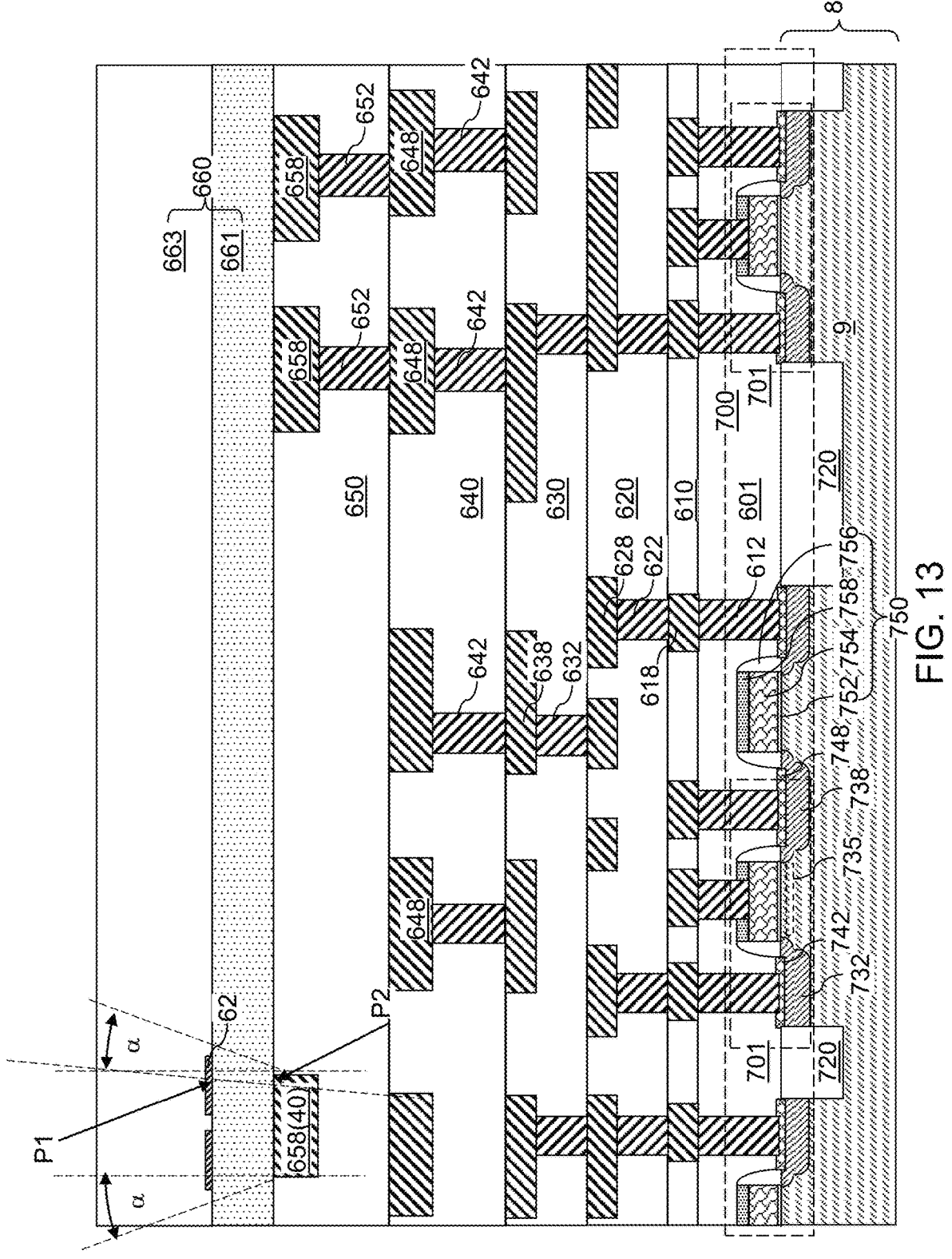
FIG. 13 is a vertical cross-sectional view of a second alternative configuration of the second exemplary structure according to an embodiment of the present disclosure.

Referring to FIG. 13, a second alternative configuration of the second exemplary structure may be derived from the second exemplary structure illustrated in FIG. 11 by omitting formation of the array of second upper ferromagnetic plates 66, and by omitting formation of the array of upper nonmagnetic metallic plates 64.

Figure 14A:
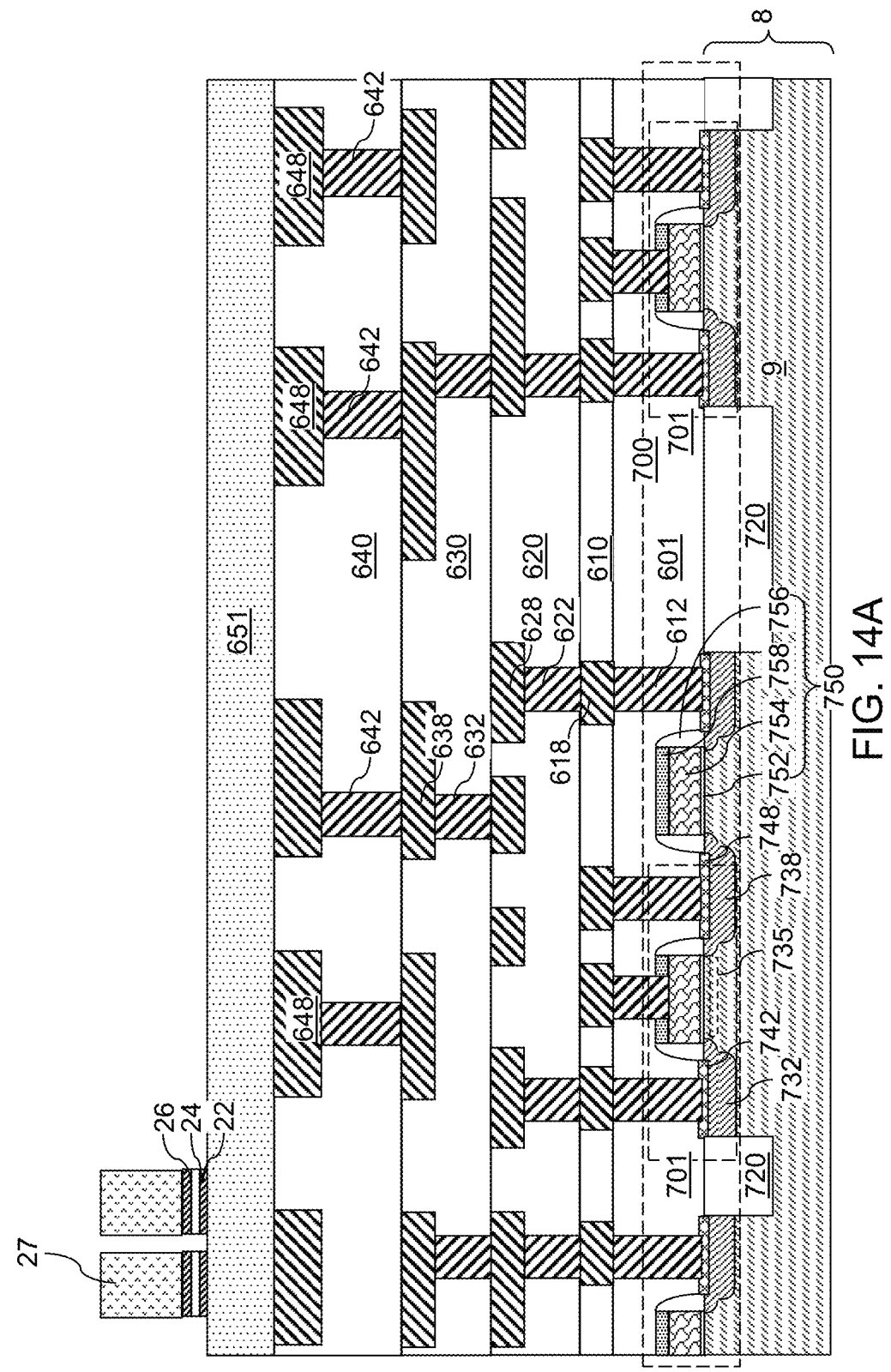
FIG. 14A is a vertical cross-sectional view of a third exemplary structure after formation of an array of first lower ferromagnetic plates, an array of lower nonmagnetic metallic plates, and an array of second lower ferromagnetic plates according to an embodiment of the present disclosure.
Figure 14B:
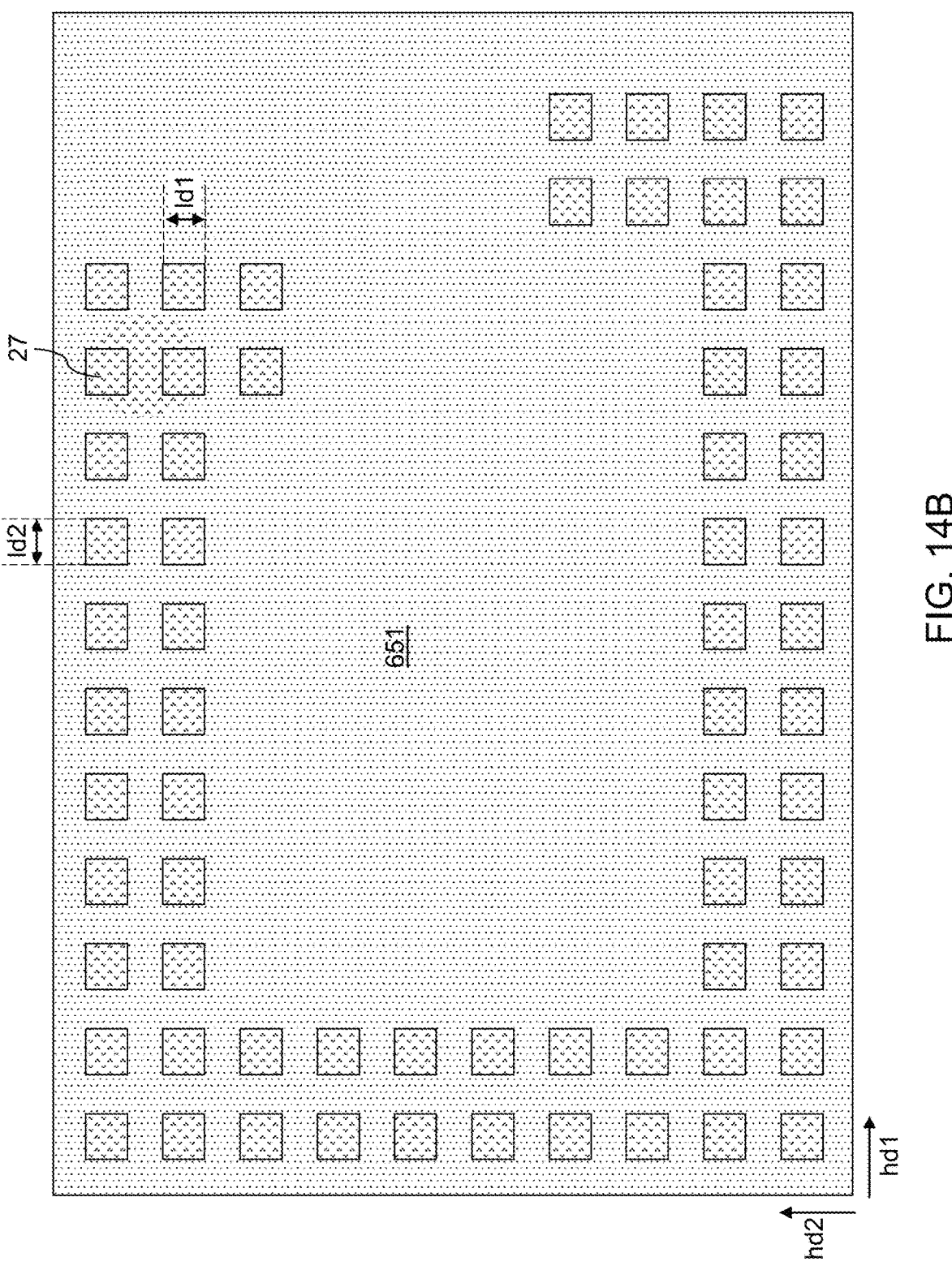
FIG. 14B is a top-down view of the third exemplary structure of FIG. 14A.
Figure 14C:
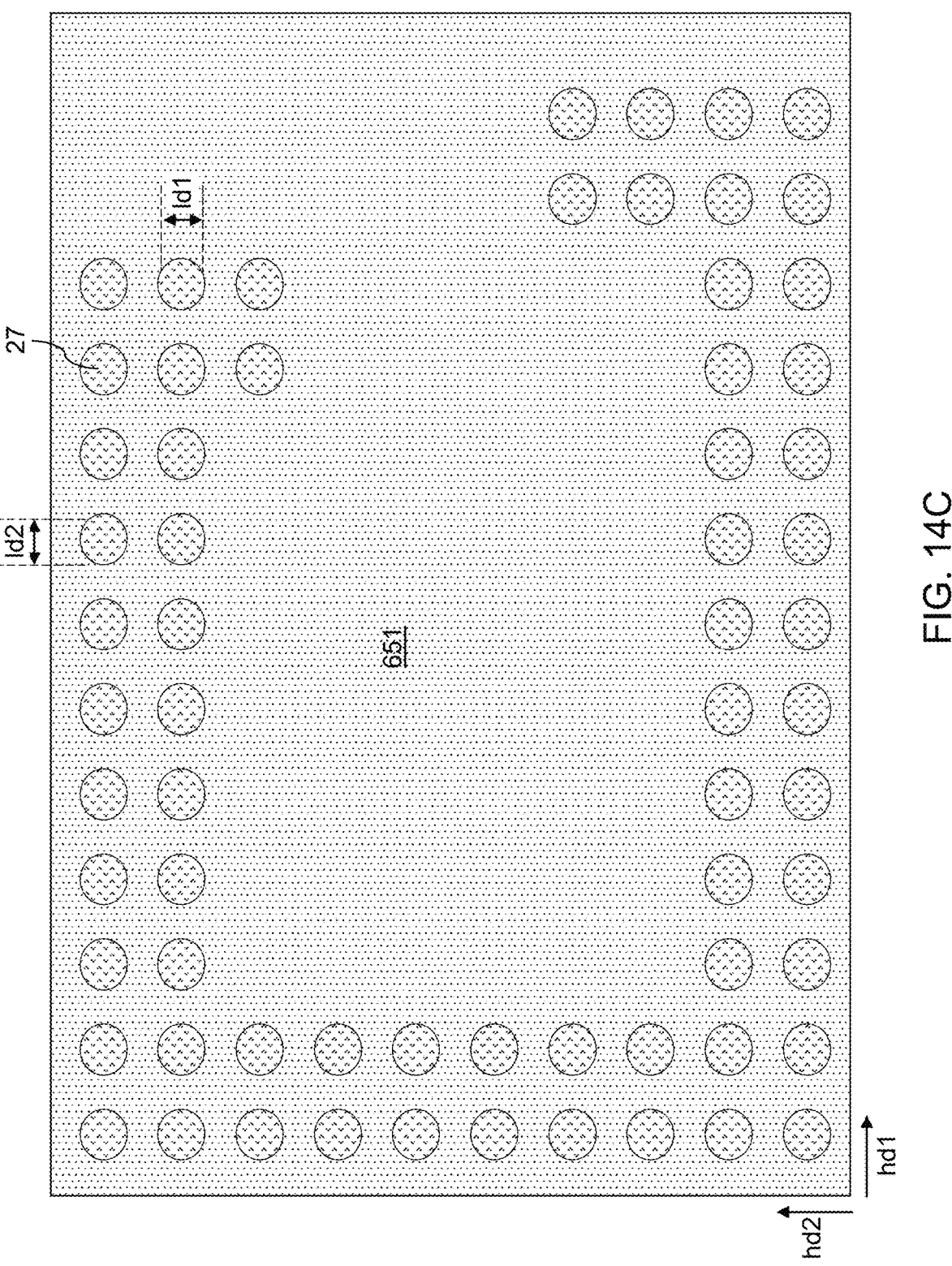
FIG. 14C is a top-down view of an alternative configuration of the third exemplary structure of FIG. 14A.

Referring to FIGS. 14A-14C, a third exemplary structure according to an embodiment of the present disclosure may be derived from the first exemplary structure illustrated in FIGS. 2A and 2B by forming a base dielectric material layer 651, an array of first lower ferromagnetic plates 22, an array of lower nonmagnetic metallic plates 24, and an array of second lower ferromagnetic plates 26.

The base dielectric material layer 651 may be formed over the fourth interconnect-level dielectric material layer 640. The base dielectric material layer 651 includes a dielectric material such as undoped silicate glass, a doped silicate glass, organosilicate glass, or a porous dielectric material, and may be deposited by chemical vapor deposition. The thickness of the base dielectric material layer 651 may be in a range from 20 nm to 300 nm, although lesser and greater thicknesses may also be used.

An lower layer stack containing a first lower ferromagnetic material layer 22, an lower nonmagnetic metallic material layer 24, and a second lower ferromagnetic material layer 26 may be formed over the base dielectric material layer 651. The first lower ferromagnetic material layer 22 includes a ferromagnetic material that is ferromagnetic at room temperature (i.e., 20 degrees Celsius) in a bulk form, and the second lower ferromagnetic material layer 26 includes another ferromagnetic material that is ferromagnetic at room temperature in a bulk form. Each of the first lower ferromagnetic material layer 22 and the second lower ferromagnetic material layer 26 may be independently and interchangeably referred to as a first ferromagnetic material layer or as a second ferromagnetic material layer in the claims of the instant application. Generally, ordinals are not a part of a name for an element represented by a reference numeral. The lower nonmagnetic metallic material layer includes a nonmagnetic metallic material 24.

Each ferromagnetic material of the first lower ferromagnetic material layer 22 and the second lower ferromagnetic material layer 26 may be independently selected from ferromagnetic materials that each have a perpendicular magnetic anisotropy (PMA) in a thin film form, such as in a form of a film having a thickness less than 10 nm. Perpendicular magnetic anisotropy refers to a reduction of a total energy of a system upon alignment of a magnetization along a direction that is perpendicular to a surface of a thin film. For example, each ferromagnetic material of the first lower ferromagnetic material layer 22 and the second lower ferromagnetic material layer 26 may be independently selected from Fe, Co, Ni, NiFe, CoFe, NiCo, NiCoFe, compound rare earth-containing ferromagnetic materials, and ferromagnetic alloys thereof. Optionally, the ferromagnetic materials of the first lower ferromagnetic material layer 22 and the second lower ferromagnetic material layer 26 may be independently doped with a respective dopant element that may be selected from B, C, O, Ta, W, Zr, Pt, Mo, Mn, Ru, Mg, Hf, Ir, etc.

The first lower ferromagnetic material layer 22 may have a first thickness, and the second lower ferromagnetic material layer 26 may have a second thickness. According to an aspect of the present disclosure, each of the first lower ferromagnetic material layer 22 and the second lower ferromagnetic material layer 26 may be formed with a respective thickness that is less than 10 nm. In one embodiment, each of the first lower ferromagnetic material layer 22 and the second lower ferromagnetic material layer 26 may have a respective thickness in a range from 1 nm to 9.9 nm, such as from 2 nm to 6 nm. The limitation of the thicknesses of the first lower ferromagnetic material layer 22 and the second lower ferromagnetic material layer 26 below 10 nm has the effect of orienting the easy axis of magnetization of the ferromagnetic material along the vertical direction. Each of the first lower ferromagnetic material layer 22 and the second lower ferromagnetic material layer 26 may be formed, for example, by a respective physical vapor deposition process.

The nonmagnetic metallic material of the lower nonmagnetic metallic material layer 24 may be selected from Ta, Mo, W, Hf, Zr, Ru, Pt, Pd, or any other nonmagnetic transition metal element. The thickness of the lower nonmagnetic metallic material layer 24 may be in a range from 3 nm to 100 nm, such as from 10 nm to 30 nm, although lesser and greater thicknesses may also be used. The lower nonmagnetic metallic material layer 24 may be formed by chemical vapor deposition or physical vapor deposition. The lower nonmagnetic metallic material layer 24 may be prior to formation of the second lower ferromagnetic material layer 26, and after formation of the first lower ferromagnetic material layer 22 such that the lower nonmagnetic metallic material layer 24 is in direct contact with each of the first lower ferromagnetic material layer 22 and the second lower ferromagnetic material layer 26. It is noted that each of the first lower ferromagnetic material layer 22 and the second lower ferromagnetic material layer 26 may be interchangeably referred to as a first ferromagnetic material layer or a second ferromagnetic material layer in the claims of the instant application.

In some embodiments, the nonmagnetic metallic material of the lower nonmagnetic metallic material layer 24 may be selected such that the perpendicular magnetic anisotropy of the ferromagnetic material of the first lower ferromagnetic material layer 22 and the perpendicular magnetic anisotropy of the ferromagnetic material of the second lower ferromagnetic material layer 26 increase through magnetic coupling through the lower nonmagnetic metallic material layer 24. In this embodiment, the thickness of the lower nonmagnetic metallic material layer 24 may be selected such that the magnetization of the first lower ferromagnetic material layer 22 is ferromagnetically or antiferromagnetically coupled to the magnetization of the second lower ferromagnetic material layer 26. In one embodiment, the magnetization of the first lower ferromagnetic material layer 22 and the magnetization of the second lower ferromagnetic material layer 26 may both point upward, or may both point downward. Alternatively, one of the magnetization of the first lower ferromagnetic material layer 22 and the magnetization of the second lower ferromagnetic material layer 26 may point upward, and another of the magnetization of the first lower ferromagnetic material layer 22 and the magnetization of the second lower ferromagnetic material layer 26 may point downward.

In another embodiment, at least one repetition of an additional lower nonmagnetic metallic material layer (not shown) and an additional lower ferromagnetic material layer (not shown). In this embodiment, each additional lower nonmagnetic metallic material layer may have the same thickness range as, and may have any material composition that is allowed for, the lower nonmagnetic metallic material layer, and each additional lower ferromagnetic material layer may have the same thickness range as, and may have any material composition that is allowed for, the second lower ferromagnetic material layer. In an example, a superlattice including a multiple repetition of a unit layer stack may be formed. The unit layer stack may include a ferromagnetic material layer and a nonmagnetic metallic material layer. The number of repetitions of the unit cell in the superlattice may be in a range from 2 to 10, although a greater number may also be used.

A photoresist layer 27 may be applied over the lower layer stack, and may be lithographically patterned into a two-dimensional array of discrete photoresist material portions. In one embodiment, the two-dimensional array of discrete photoresist material portions may be a periodic two-dimensional array of discrete photoresist material portions having a first pitch along the first horizontal direction hd1 and having a second pitch along the second horizontal direction. Each of the discrete photoresist material portions may have a first lateral dimension ld1 along the first horizontal direction hd1, and a second lateral dimension ld2 along the second horizontal direction hd2. Each of the discrete photoresist material portions may have a respective horizontal cross-sectional shape, which may be a shape of a square as illustrated in FIG. 14B, a shape of a circle as illustrated in FIG. 14C, or a shape of a rectangle, a rounded rectangle, an oval, or any two-dimensional shape having a closed periphery.

According to an aspect of the present disclosure, the first lateral dimension ld1 and the second lateral dimension ld2 of each of the discrete photoresist material portions may be in a range from 10 nm to 200 nm, such as from 20 nm to 100 nm. According to an aspect of the present disclosure, the discrete photoresist material portions may be formed within areas having an areal overlap with an inductive metal line to be subsequently formed, or within areas located in an immediate vicinity of such areas.

An anisotropic etch process may be performed to transfer the pattern of the discrete photoresist material portions through the lower layer stack. The patterned photoresist layer may be used as the etch mask for the anisotropic etch process. A terminal etch step of the anisotropic etch process that etches through the first lower ferromagnetic material layer may be selective to the material of the base dielectric material layer 651. The second lower ferromagnetic material layer may be divided into a two-dimensional array of second lower ferromagnetic plates 26. The lower nonmagnetic metallic material layer may be divided into a two-dimensional array of lower nonmagnetic metallic plates 24. The first lower ferromagnetic material layer may be divided into a two-dimensional array of first lower ferromagnetic plates 22. The patterned photoresist layer may be subsequently removed, for example, by ashing.

In one embodiment, each of the lower nonmagnetic metallic plates 24 may have a same horizontal cross-sectional shape as an overlying second lower ferromagnetic plate 26 and as an underlying first lower ferromagnetic plate 22. In one embodiment, each sidewall of a lower nonmagnetic metallic plate 24 may be vertically coincident with a sidewall of an overlying second lower ferromagnetic plate 26 and with a sidewall of an underlying first lower ferromagnetic plate 22. In one embodiment, each of the first lower ferromagnetic plates 22, the lower nonmagnetic metallic plates 24, and the second lower ferromagnetic plates 26 may have a maximum lateral dimension in a range from 10 nm to 200 nm, such as from 20 nm to 100 nm. In one embodiment, each first lower ferromagnetic plate 22 within the array of first lower ferromagnetic plates 22 has a maximum vertical dimension less than 10 nm. In one embodiment, each second lower ferromagnetic plate 26 within the array of second lower ferromagnetic plates 26 has a maximum vertical dimension less than 10 nm.

In one embodiment, each of the first lower ferromagnetic plates 22 comprises a ferromagnetic material that is ferromagnetic at room temperature, and each of the second lower ferromagnetic plates 26 comprises another ferromagnetic material that is ferromagnetic at room temperature. The coverage ratio of the second lower ferromagnetic plates 26, as defined by the ratio of the sum of the areas of the second lower ferromagnetic plates 26 relative to the area of a region including the second lower ferromagnetic plates 26, may be in a range from 0.10 to 0.90, such as from 0.15 to 0.80 and/or from 0.20 to 0.70, although lesser and greater coverage ratios may also be used.

In one embodiment, an array of lower nonmagnetic metallic plates 24 may be in contact with the array of first lower ferromagnetic plates 22 and the array of second ferromagnetic particles 26. In one embodiment, each of the lower nonmagnetic metallic plates 24 may have a same areas a respective underlying first lower ferromagnetic plate 22 within the array of first lower ferromagnetic plates 22, and may have same areas a respective overlying second lower ferromagnetic plate 26 within the array of second lower ferromagnetic plates 26.

Figure 15A:
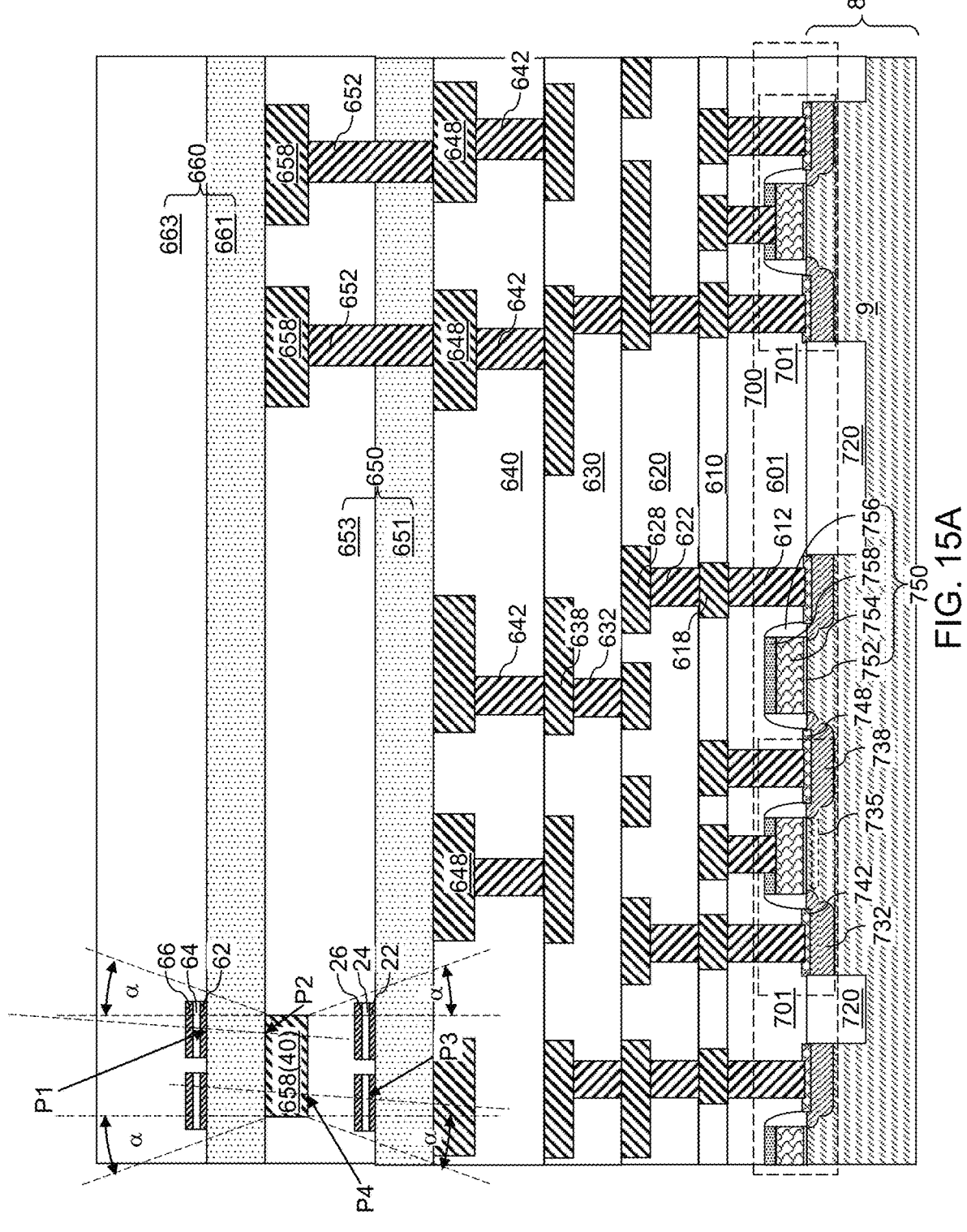
FIG. 15A is a vertical cross-sectional view of the third exemplary structure after formation of an array of first upper ferromagnetic plates, an array of upper nonmagnetic metallic plates, an array of second upper ferromagnetic plates, and an over-inductor-level insulating layer according to an embodiment of the present disclosure.
Figure 15B:
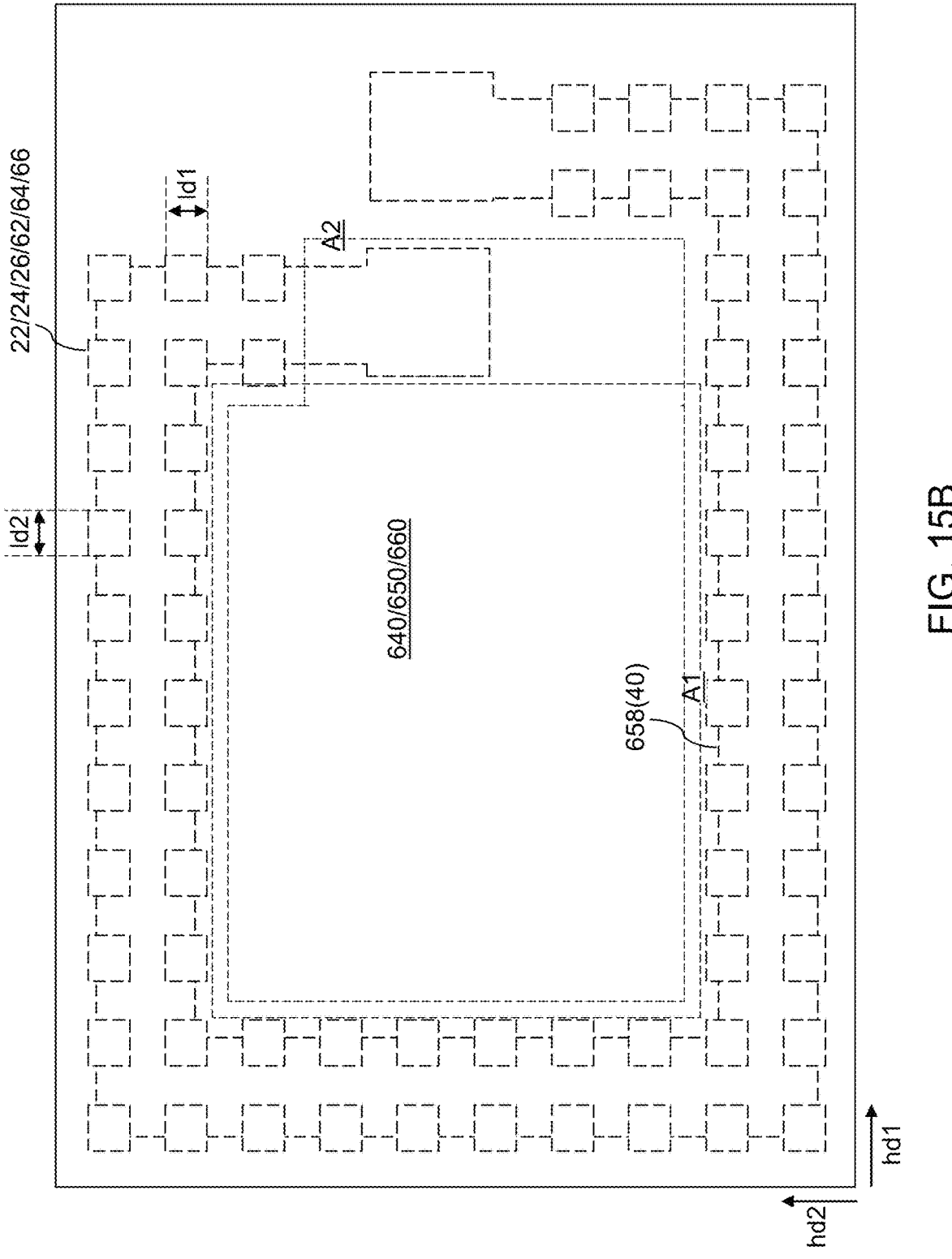
FIG. 15B is a top-down view of the third exemplary structure of FIG. 15A.
Figure 15C:
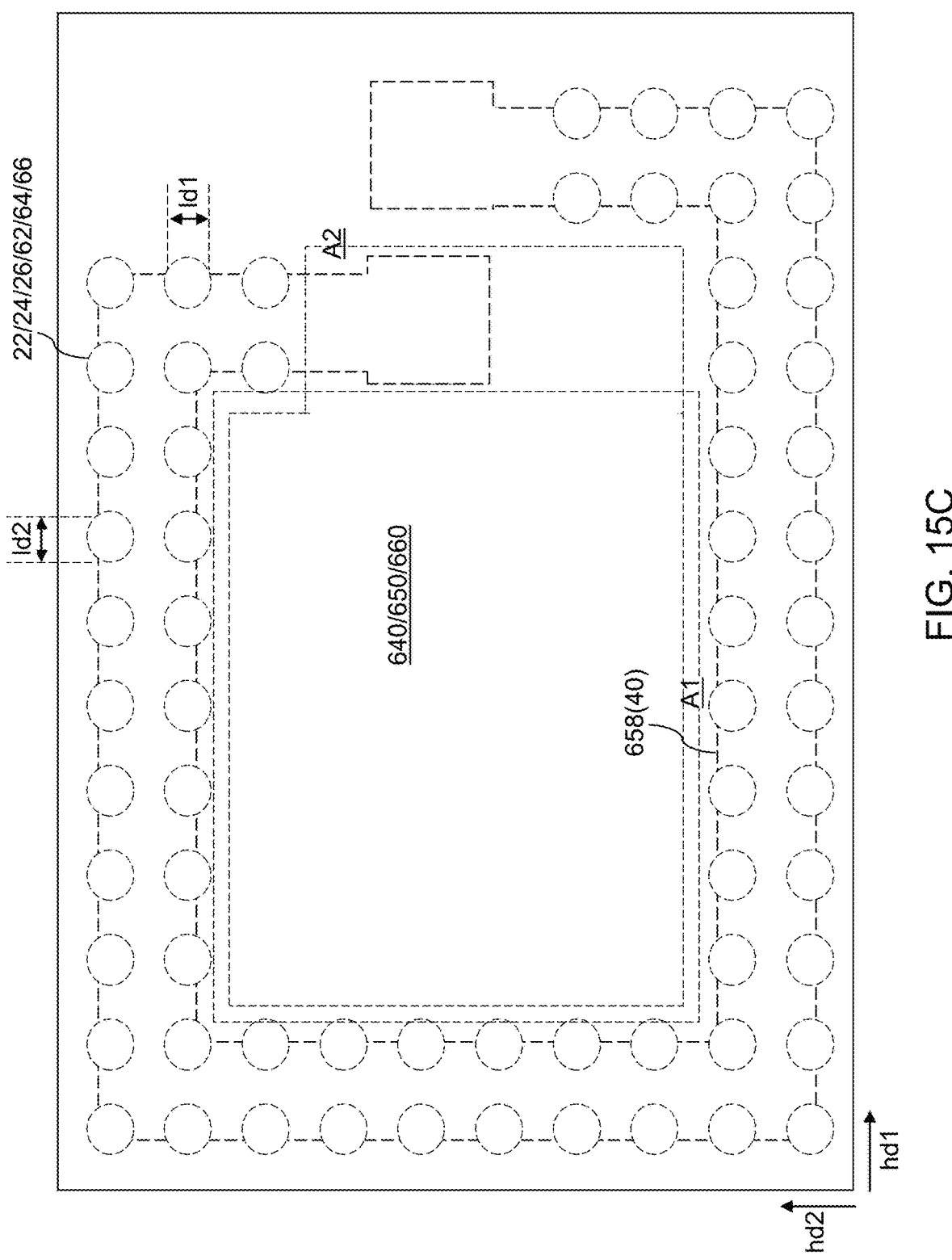
FIG. 15C is a top-down view of an alternative configuration of the third exemplary structure of FIG. 15A.

Referring to FIGS. 15A-15C, a capping dielectric material layer 653 may be deposited over the base dielectric material layer 651. The combination of the base dielectric material layer 651 and the capping dielectric material layer 653 constitutes an interconnect-level dielectric material layer such as a fifth interconnect-level dielectric material layer 650.

The processing steps described with reference to FIGS. 3A and 3B or the processing steps described with reference to FIGS. 9A-9C may be performed to form inductor-level metal interconnect structures (652, 658) in the fifth interconnect-level dielectric material layer 650. The inductor-level metal interconnect structures (652, 658) comprise inductor-level metal line structures (which may be fifth metal line structures 658) and inductor-level metal via structures (which may be fourth metal via structures 652). The inductor-level metal line structures include an inductive metal line 40 that is an inductor structure. Generally, the inductor-level metal interconnect structures (652, 658) may be formed by forming via cavities and line cavities in the fifth interconnect-level dielectric material layer 650, and by filling the via cavities and the line cavities with at least one metallic fill material.

Generally, the inductive metal line 40 may be located in a dielectric material layer (which may comprise any interconnect-level dielectric material layer such as a fifth interconnect-level dielectric material layer 650) that overlies a semiconductor substrate 8 and laterally encloses a first area A1. The inductive metal line 40 overlies an array of first lower ferromagnetic plates 22 comprising a first lower ferromagnetic material. According to an aspect of the present disclosure, the inductive metal line 40 and the array of first lower ferromagnetic plates 22 are formed in a geometry in which, for any third point P3 that is selected within volumes of the first lower ferromagnetic plates 22, a respective fourth point P4 exists within a horizontal surface of the inductive metal line 40 such that a line connecting the third point P3 and the fourth point P4 is vertical or has a respective first taper angle φ that is less than 20 degrees with respective to a vertical direction. For example, a volume may be defined from the inductive metal line 40 such that the volume is located below the horizontal plane including the bottom surface of the inductive metal line 40, and is laterally enclosed by a set of tilted planes that pass through a respective edge of the bottom surface of the inductive metal line 40 and are tilted outward along a downward direction with a tilt angle φ of 20 degrees. The entirety of the first lower ferromagnetic plates 22 and the second lower ferromagnetic plates 26 may be located in the volume thus defined.

Formation of the first lower ferromagnetic plates 22 and the second lower ferromagnetic plates 26 within this volume provides the benefit of ensuring that magnetic field generated by the inductive metal line 40 is horizontal or substantially horizontal. In one embodiment, the magnetic field generated by the inductive metal line 40 may be along a respective direction at each point within the first lower ferromagnetic plates 22 and the second lower ferromagnetic plates 26 that does not deviate from the horizontal direction by more than 20 degrees. Thus, a predominant component of the magnetic field is horizontal at each point within the first lower ferromagnetic plates 22 and the second lower ferromagnetic plates 26, and thus, is applied along a direction of a hard axis of magnetization, i.e., along a direction in which magnetic alignment of the magnetization of the ferromagnetic materials of the first lower ferromagnetic plates 22 and the second lower ferromagnetic plates 26 do not align easily. Generally, the inductive metal line 40 may comprise multiple loop segments that are interconnected to one another in a spiral configuration, or may comprise a single loop segment.

In one embodiment, the array of first lower ferromagnetic plates 22 laterally encloses a second area A2 that has a partial overlap with the first area A1 in a plan view, and is free of any ferromagnetic material. In one embodiment, each of the first lower ferromagnetic plates 22 is located such that any magnetic field generated by an electrical current passing through the inductive metal line 40 and passing through any of the first lower ferromagnetic plates 22 has a greater horizontal magnetic field strength than a vertical magnetic field strength. In one embodiment, each of the first lower ferromagnetic plates 22 has a respective maximum lateral dimension that is greater than twice a vertical dimension of the first lower ferromagnetic plates 22.

In one embodiment, each first lower ferromagnetic plate 22 within the array of first lower ferromagnetic plates 22 has a maximum vertical dimension less than 10 nm. In one embodiment, each first lower ferromagnetic plate 22 within the array of first lower ferromagnetic plates 22 has a maximum lateral dimension in a range from 10 nm to 200 nm.

In one embodiment, a ratio of an overlap area between the inductive metal line 40 and the array of first lower ferromagnetic plates 22 in a plan view to a total area of the inductive metal line 40 in the plan view is in a range from 0.10 to 0.90. An array of nonmagnetic metallic plates 24 may be in contact with the array of first lower ferromagnetic plates 22. Each of the nonmagnetic metallic plates 24 has a same areas as a respective overlying or underlying first lower ferromagnetic plate 22 within the array of first lower ferromagnetic plates 22. In one embodiment, an array of second lower ferromagnetic plates 26 may be in contact with the array of nonmagnetic metallic plates 24. The array of second lower ferromagnetic plates 26 comprises a second lower ferromagnetic material.

The array of nonmagnetic metallic plates 24 may be in contact with the array of first lower ferromagnetic plates 22. Each of the nonmagnetic metallic plates 24 has a same areas as a respective overlying or underlying first lower ferromagnetic plate 22 within the array of first lower ferromagnetic plates 22.

The ferromagnetic plates (22, 26) of the present disclosure increases the inductance of the inductor structure of the present disclosure by providing a high permeability material within the paths of the magnetic field generated by the inductive metal line 40. The total area of the inductor structure may be decreased due to the increase in the effective permeability of the materials around the inductive metal line 40. The perpendicular magnetic anisotropy (PMA) energy of the ferromagnetic materials in the ferromagnetic plates (22, 26) hinder alignment of the magnetic moments of the ferromagnetic materials in the ferromagnetic plates (22, 26) along horizontal directions, and thus, reduces or eliminates hysteresis effect and energy loss, and increases the Q factor of the inductor structure of the present disclosure. Further, the saturation field for the ferromagnetic materials of the ferromagnetic plates (22, 26) along horizontal directions is much larger than the saturation field along the vertical direction. Thus, the inductor structure of the present disclosure may use magnetic fields having a much greater magnetic field strength than any structure using ferromagnetic materials having an easy axis of magnetization along a horizontal direction.

Subsequently, the processing steps described with reference to FIGS. 4, 5A-5C, and 6, or variations of such processing steps described with reference to FIGS. 7, 8, and/or 11A-13 may be performed to form a base dielectric material layer 661, an array of first upper ferromagnetic plates 62, an optional array of upper nonmagnetic metallic plates 64, and an optional array of second upper ferromagnetic plates 66, and a capping dielectric material layer 663.

Generally, the inductive metal line 40 may be located in a dielectric material layer (which may comprise any interconnect-level dielectric material layer such as a fifth interconnect-level dielectric material layer 650) that overlies a semiconductor substrate 8 and laterally encloses a first area A1. An array of first upper ferromagnetic plates 62 comprising a first upper ferromagnetic material may overlie the inductive metal line 40. According to an aspect of the present disclosure, the inductive metal line 40 and the array of first upper ferromagnetic plates 62 are formed in a geometry in which, for any first point P1 that is selected within volumes of the first upper ferromagnetic plates 62, a respective second point P2 exists within a horizontal surface of the inductive metal line 40 such that a line connecting the first point P1 and the second point P2 is vertical or has a respective first taper angle that is less than 20 degrees with respective to a vertical direction. For example, a volume may be defined from an inductive metal line 40 such that the volume is located above the horizontal plane including the top surface of the inductive metal line 40, and is laterally enclosed by a set of tilted planes that pass through a respective edge of the top surface of the inductive metal line 40 and are tilted outward along an upward direction with a tilt angle α of 20 degrees. The entirety of the first upper ferromagnetic plates 62 and the second upper ferromagnetic plates 66 may be located in the volume thus defined.

Formation of the first upper ferromagnetic plates 62 and the second upper ferromagnetic plates 66 within this volume provides the benefit of ensuring that magnetic field generated by the inductive metal line 40 is horizontal or substantially horizontal. In one embodiment, the magnetic field generated by the inductive metal line 40 may be along a respective direction at each point within the first upper ferromagnetic plates 62 and the second upper ferromagnetic plates 66 that does not deviate from the horizontal direction by more than 20 degrees. Thus, a predominant component of the magnetic field is horizontal at each point within the first upper ferromagnetic plates 62 and the second upper ferromagnetic plates 66, and thus, is applied along a direction of a hard axis of magnetization, i.e., along a direction in which magnetic alignment of the magnetization of the ferromagnetic materials of the first upper ferromagnetic plates 62 and the second upper ferromagnetic plates 66 do not align easily.

Generally, the inductive metal line 40 may comprise multiple loop segments that are interconnected to one another in a spiral configuration, or may comprise a single loop segment.

In one embodiment, the array of first upper ferromagnetic plates 62 laterally encloses a second area A2 that has a partial overlap with the first area A1 in a plan view, and is free of any ferromagnetic material. In one embodiment, each of the first upper ferromagnetic plates 62 is located such that any magnetic field generated by an electrical current passing through the inductive metal line 40 and passing through any of the first upper ferromagnetic plates 62 has a greater horizontal magnetic field strength than a vertical magnetic field strength. In one embodiment, each of the first upper ferromagnetic plates 62 has a respective maximum lateral dimension that is greater than twice a vertical dimension of the first upper ferromagnetic plates 62.

In one embodiment, each first upper ferromagnetic plate 62 within the array of first upper ferromagnetic plates 62 has a maximum vertical dimension less than 10 nm. In one embodiment, each first upper ferromagnetic plate 62 within the array of first upper ferromagnetic plates 62 has a maximum lateral dimension in a range from 10 nm to 200 nm.

In one embodiment, a ratio of an overlap area between the inductive metal line 40 and the array of first upper ferromagnetic plates 62 in a plan view to a total area of the inductive metal line 40 in the plan view is in a range from 0.10 to 0.90. An array of nonmagnetic metallic plates 64 may be in contact with the array of first upper ferromagnetic plates 62. Each of the nonmagnetic metallic plates 64 has a same areas as a respective overlying or underlying first upper ferromagnetic plate 62 within the array of first upper ferromagnetic plates 62. In one embodiment, an array of second upper ferromagnetic plates 66 may be in contact with the array of nonmagnetic metallic plates 64. The array of second upper ferromagnetic plates 66 comprises a second upper ferromagnetic material.

The array of nonmagnetic metallic plates 64 may be in contact with the array of first upper ferromagnetic plates 62. Each of the nonmagnetic metallic plates 64 has a same areas as a respective overlying or underlying first upper ferromagnetic plate 62 within the array of first upper ferromagnetic plates 62.

The ferromagnetic plates (62, 66) of the present disclosure increase the inductance of the inductor structure of the present disclosure by providing a high permeability material within the paths of the magnetic field generated by the inductive metal line 40. The total area of the inductor structure may be decreased due to the increase in the effective permeability of the materials around the inductive metal line 40. The perpendicular magnetic anisotropy (PMA) energy of the ferromagnetic materials in the ferromagnetic plates (62, 66) hinder alignment of the magnetic moments of the ferromagnetic materials in the ferromagnetic plates (62, 66) along horizontal directions, and thus, reduce or eliminate hysteresis effect and energy loss, and increases the Q factor of the inductor structure of the present disclosure. Further, the saturation field for the ferromagnetic materials of the ferromagnetic plates (62, 66) along horizontal directions is much larger than the saturation field along the vertical direction. Thus, the inductor structure of the present disclosure may use magnetic fields having a much greater magnetic field strength than any structure using ferromagnetic materials having an easy axis of magnetization along a horizontal direction.

Sixth metal line structures (not shown) and fifth metal via structures (not shown) may be formed in the sixth interconnect-level dielectric material layer 660. Additional interconnect-level dielectric material layers (not shown) and additional metal interconnect structures (not shown) and/or metallic bonding pads (not shown) may be formed above the sixth interconnect-level dielectric material layer 660 as needed.

Figure 16:
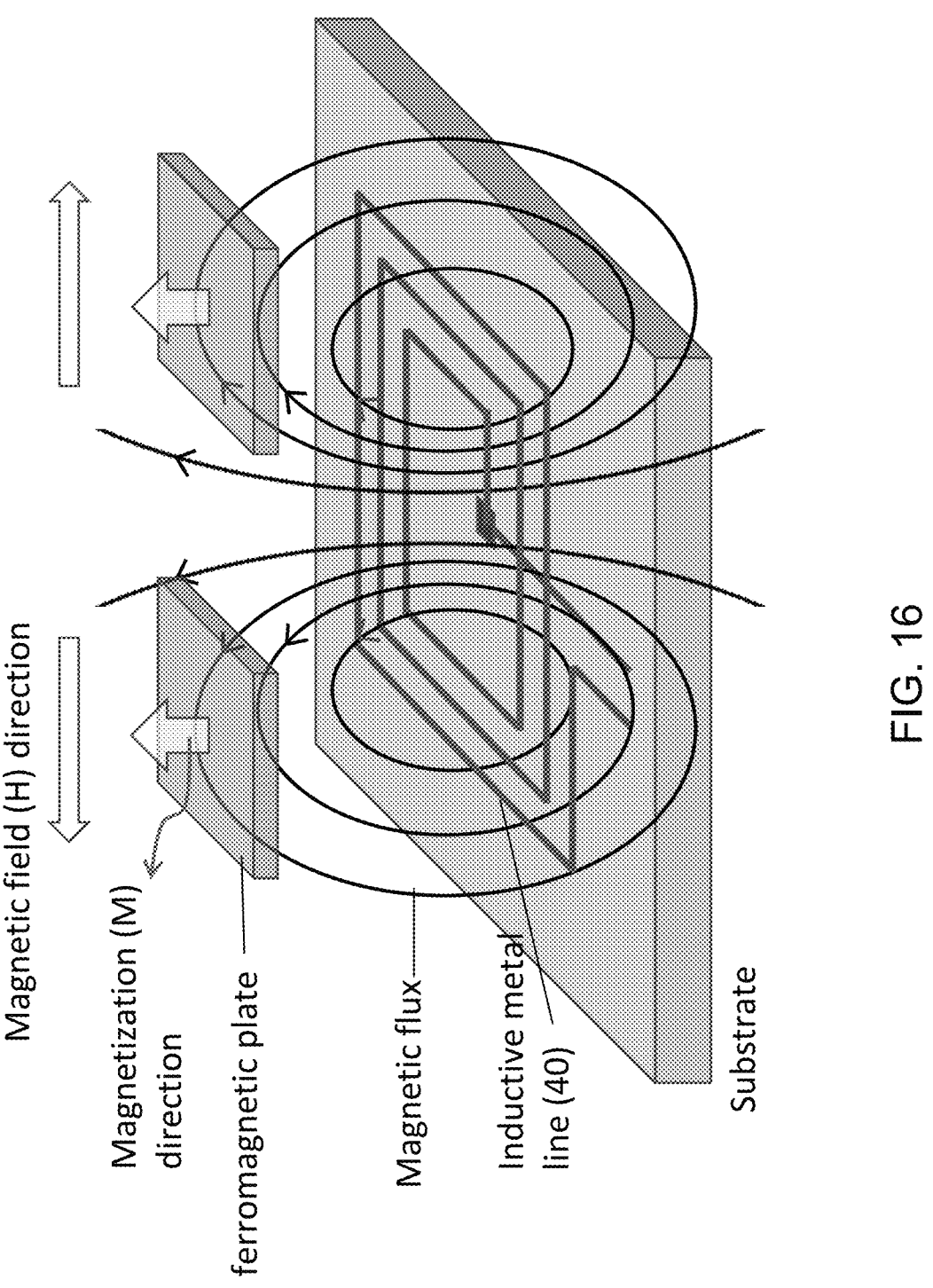
FIG. 16 is a schematic perspective view of an exemplary structure while a magnetic flux is generated by an inductive metal line according to an embodiment of the present disclosure.

Referring to FIG. 16, a schematic perspective view of an exemplary structure of the present disclosure is illustrated while a magnetic flux is generated by an inductive metal line 40 according to an embodiment of the present disclosure. The magnetic field generated by the inductive metal line is substantially horizontal within the ferromagnetic plates (22, 26, 62, 66) of the present disclosure. Further, the magnetization direction within the ferromagnetic plates (22, 26 62, 66) is vertical or substantially vertical within the operating range of magnetic field strengths of the inductive metal line 40. Thus, hysteresis effect in the ferromagnetic plates (22, 26, 62, 66) is eliminated or minimized in the ferromagnetic plates (22, 26, 62, 66) while the ferromagnetic plates (22, 26, 62, 66) increases the effective permeability of the space around the inductive metal line 40.

Figure 17:
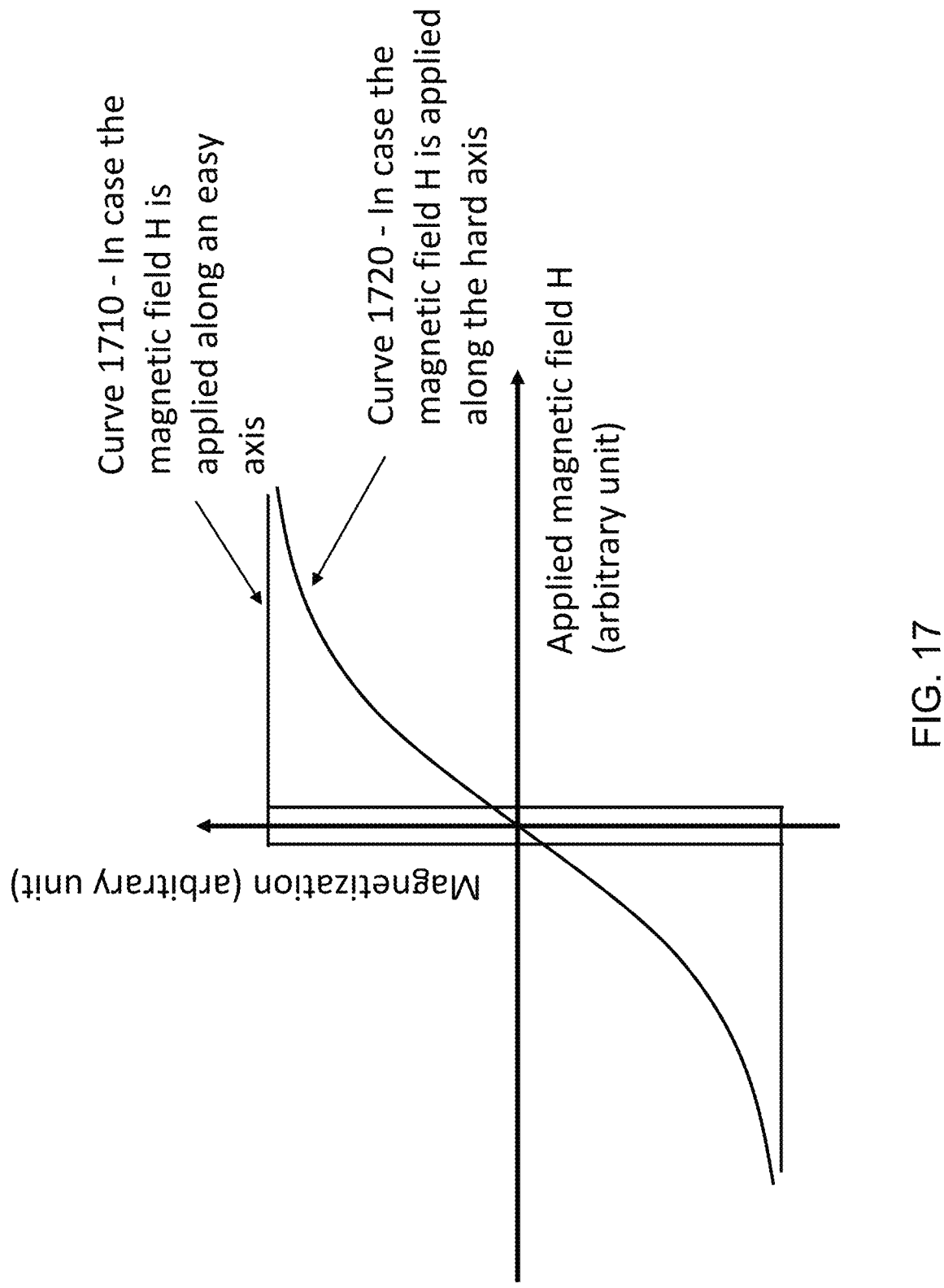
FIG. 17 illustrates magnetization curves for an easy axis of magnetization and for a hard axis of magnetization.

Referring to FIG. 17, two magnetization curves for the ferromagnetic material in the ferromagnetic plates (22, 26, 62, 66) of the present disclosure is illustrated. The first magnetization curve 1710 corresponds to the embodiment in which a perpendicular magnetic anisotropy (PMA) ferromagnetic material within the ferromagnetic plates (22, 26, 62, 66) of the present disclosure is subjected to a vertical magnetic field. Magnetic saturation is easily achieved at a low magnetic field strength, and the first magnetization curve 1710 exhibits a large hysteresis effect. The second magnetization curve 1720 corresponds to the embodiment in which the perpendicular magnetic anisotropy (PMA) ferromagnetic material within the ferromagnetic plates (22, 26, 62, 66) of the present disclosure is subjected to a horizontal magnetic field. Magnetic saturation is difficult to achieve, and the second magnetization curve 1710 exhibits no hysteresis effect.

Figure 18:
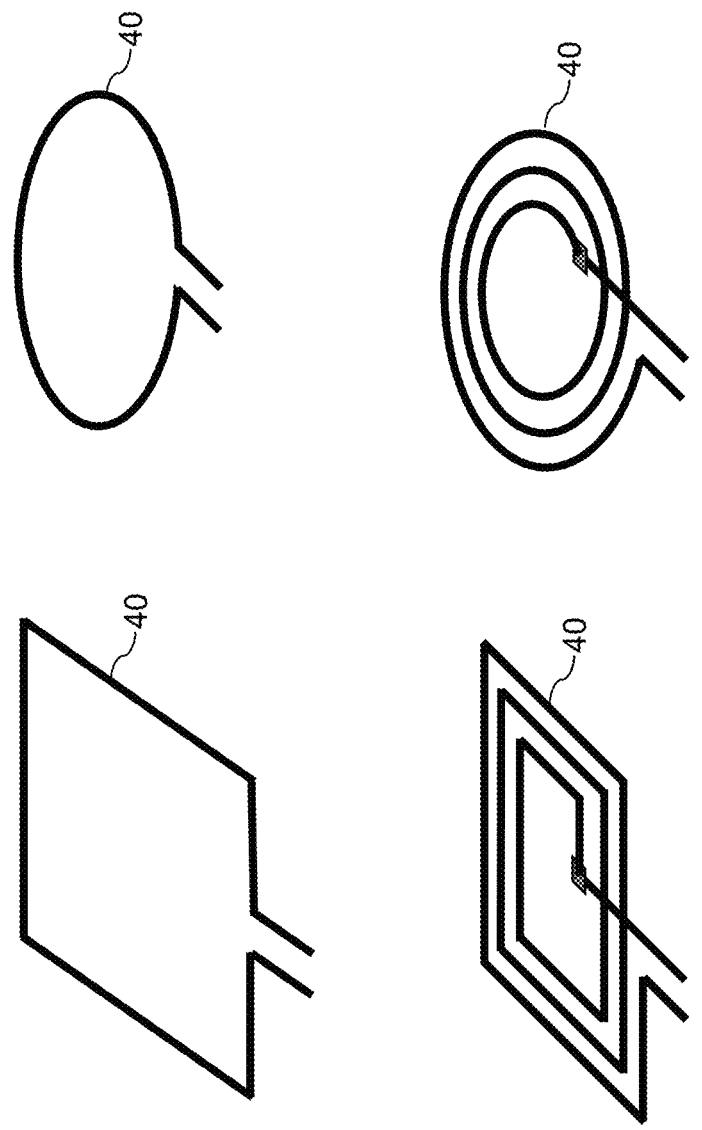
FIG. 18 illustrates various exemplary configurations for the inductive metal line of the present disclosure.

Generally, the inductive metal line 40 of the present disclosure may be formed in various configurations, which may contain a single loop or multiple loops. FIG. 18 illustrates various exemplary configurations for the inductive metal line 40 of the present disclosure. In embodiments in which the inductive metal line 40 is formed as a single coil structure, the metal routing of the inductive metal line 40 may be formed within one metal layer of a semiconductor back-end-of-line (BEOL) structure. In embodiments in which the inductive metal line 40 is formed as a multi-coil structure, the metal routing of the inductive metal line 40 may use two or more metal layers of the semiconductor BEOL structure.

Referring to FIG. 19, a first flowchart illustrates steps for forming an exemplary structure according to an embodiment of the present disclosure.

Referring to step 1910 and FIGS. 1-3B, 7-13, and 15A-15C, an inductive metal line 40 may be formed above insulating material layers (601, 610, 620, 630) overlying a semiconductor substrate 8. The inductive metal line 40 laterally encloses an area such as a first area A1.

Referring to step 1920 and FIGS. 4, 7-13, and 15A-15C, a first ferromagnetic material layer 62L comprising a first ferromagnetic material may be formed over the inductive metal line 40. The first ferromagnetic material layer 22 comprises a first metallic material that is ferromagnetic in a bulk form at room temperature.

Referring to step 1930 and FIGS. 5A-13 and 15A-15C, the first ferromagnetic material layer 62L may be patterned into an array of first ferromagnetic plates 62.

Referring to FIG. 20, a second flowchart illustrates steps for forming an exemplary structure according to an embodiment of the present disclosure.

Referring to step 2010 and FIGS. 1, 2A, 2B, and 14A-14C, a first ferromagnetic material layer comprising a first ferromagnetic material may be formed over dielectric material layers (601, 610, 620, 630) overlying a semiconductor substrate 8. The first ferromagnetic material layer comprises a first metallic material that is ferromagnetic in a bulk form at room temperature.

Referring to step 2020 and FIGS. 14A-14C, the first ferromagnetic material layer may be patterned into an array of first ferromagnetic plates 22.

Referring to step 2030 and FIGS. 15A-15C, an inductive metal line 40 may be formed above the array of first ferromagnetic plates 22. The inductive metal line 40 laterally encloses an area such as a first area A.

Referring to all drawings and according to various embodiments of the present disclosure, a semiconductor structure is provided, which comprises: an inductive metal line 40 located in a first dielectric material layer (which may comprise any interconnect-level dielectric material layer such as a fifth interconnect-level dielectric material layer 650) that overlies a semiconductor substrate 8 and laterally encloses a first area A1; and an array of first ferromagnetic plates (22 or 62) comprising a first ferromagnetic material and overlying or underlying the inductive metal line 40, wherein: for any first point P1 that is selected within volumes of the first ferromagnetic plates (22 or 62), a respective second point P2 exists within a horizontal surface of the inductive metal line 40 such that a line connecting the first point P1 and the second point P2 is vertical or has a respective first taper angle that is less than 20 degrees with respective to a vertical direction.

In one embodiment, the array of first ferromagnetic plates (22 or 62) laterally encloses a second area A2 that has a partial overlap with the first area A1 in a plan view, and is free of any ferromagnetic material. In one embodiment, each of the first ferromagnetic plates (22 or 62) is located such that any magnetic field generated by an electrical current passing through the inductive metal line 40 and passing through any of the first ferromagnetic plates (22 or 62) has a greater horizontal magnetic field strength tan a vertical magnetic field strength.

In one embodiment, each of the first ferromagnetic plates (22 or 62) has a respective maximum lateral dimension that is greater than twice a vertical dimension of the first ferromagnetic plates (22 or 62). In one embodiment, each first ferromagnetic plate (22 or 62) within the array of first ferromagnetic plates (22 or 62) has a maximum vertical dimension less than 10 nm. In one embodiment, each first ferromagnetic plate (22 or 62) within the array of first ferromagnetic plates (22 or 62) has a maximum lateral dimension in a range from 10 nm to 200 nm.

In one embodiment, a ratio of an overlap area between the inductive metal line 40 and the array of first ferromagnetic plates (22 or 62) in a plan view to a total area of the inductive metal line 40 in the plan view is in a range from 0.10 to 0.90.

In one embodiment, the semiconductor structure comprises an array of nonmagnetic metallic plates (24 or 64) in contact with the array of first ferromagnetic plates (22 or 62), wherein each of the nonmagnetic metallic plates (24 or 64) has a same areas as a respective overlying or underlying first ferromagnetic plate (22 or 62) within the array of first ferromagnetic plates (22 or 62). In one embodiment, the semiconductor structure comprises an array of second ferromagnetic plates (26 or 66) in contact with the array of nonmagnetic metallic plates (24 or 64) and comprising a second ferromagnetic material.

In one embodiment, the array of first ferromagnetic plates 62 overlies the inductive metal line 40; the semiconductor structure comprises an array of second ferromagnetic plates (26 or 66) underlying the inductive metal line 40; each of the second ferromagnetic plates (26 or 66) comprises a second ferromagnetic material; and for any third point P3 that is selected within volumes of the second ferromagnetic plates (26 or 66), a respective fourth point P4 exists within another horizontal surface of the inductive metal line 40 such that a line connecting the third point P3 and the fourth point P4 is vertical or has a second taper angle that is less than 20 degrees with respective to the vertical direction.

In one embodiment, the inductive metal line 40 comprises multiple loop segments that are interconnected to one another in a spiral configuration.

According to an aspect of the present disclosure, a semiconductor structure is provided, which comprises: semiconductor devices located on a semiconductor substrate 8; metal interconnect structures located within dielectric material layers that overlie the semiconductor devices and electrically connected to the semiconductor devices; an inductive metal line 40 that overlies the metal interconnect structures, electrically connected to a subset of the metal interconnect structures, and laterally enclosing an area; and an array of first ferromagnetic plates (22 or 62) overlying the metal interconnect structures, and overlying or underlying the inductive metal line 40, wherein: for any first point P1 that is selected within volumes of the first ferromagnetic plates (22 or 62), a respective second point P2 exists within a horizontal surface of the inductive metal line 40 such that a line connecting the first point P1 and the second point P2 is vertical or has a respective first taper angle that is less than 20 degrees with respective to a vertical direction.

In one embodiment, the semiconductor structure comprises an array of nonmagnetic metallic plates (24 or 64) in contact with the array of first ferromagnetic plates (22 or 62), wherein each of the nonmagnetic metallic plates (24 or 64) has a same areas as a respective overlying or underlying first ferromagnetic plate (22 or 62) within the array of first ferromagnetic plates (22 or 62).

In one embodiment, the semiconductor structure comprises an array of second ferromagnetic plates (26 or 66) in contact with the array of nonmagnetic metallic plates (24 or 64) and comprising a second ferromagnetic material.

In one embodiment, the array of first ferromagnetic plates 62 overlies the inductive metal line 40; the semiconductor structure comprises an array of second ferromagnetic plates 26 comprising a second ferromagnetic material and underlying the inductive metal line 40; and for any third point P3 that is selected within volumes of the second ferromagnetic plates (26 or 66), a respective fourth point P4 exists within another horizontal surface of the inductive metal line 40 such that a line connecting the third point P3 and the fourth point P4 is vertical or has a second taper angle that is less than 20 degrees with respective to the vertical direction.

The various embodiments of the present disclosure provide inductor structures providing high inductance per unit area. High-inductance inductors may be used in wireless communications, radio-frequency (RF) integrated circuits, radar applications, power delivery applications, and electromagnetic (EM) noise reduction applications. The inductor structures of the present disclosure are highly scalable.

Particularly, the ferromagnetic plates (22, 26, 62, 66) of the present disclosure is scalable irrespective of the shape of the horizontal cross-sectional area as long as the vertical dimension (i.e., the thickness) of the ferromagnetic plates (22, 26, 62, 66) remains smaller than the lateral dimensions of the ferromagnetic plates (22, 26, 62, 66) by less than a minimum factor (such as $\frac{1}{3}$) that may provide perpendicular magnetic anisotropy (PMA) in the ferromagnetic plates (22, 26, 62, 66). The source of the perpendicular anisotropy energy is the presence of the interface with other material portions such as the material of the nonmagnetic metallic plates (24, 64). The perpendicular magnetic anisotropic energy may be higher than a shape anisotropy energy, and deviation of the direction of the magnetization of the ferromagnetic plates (22, 26, 62, 66) from the vertical axis is relatively small, and thus, hysteresis effect is small or non-existent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   an inductive metal line located in a dielectric material layer that overlies a semiconductor substrate and laterally encloses a first area;
   an array of first ferromagnetic plates comprising a first ferromagnetic material and overlying or underlying the inductive metal line, wherein,
      for any first point that is selected within volumes of the first ferromagnetic plates, a respective second point exists within a horizontal surface of the inductive metal line such that a line connecting the first point and the second point is vertical or has a respective first taper angle that is less than 20 degrees with respective to a vertical direction; and
   an array of nonmagnetic metallic plates in contact with the array of first ferromagnetic plates, wherein an nonmagnetic metallic plate selected from the array of nonmagnetic plates has a substantially same area as a respective overlying or underlying first ferromagnetic plate within the array of first ferromagnetic plates.

2. The semiconductor structure of claim 1, wherein the array of first ferromagnetic plates laterally encloses a second area that has a partial overlap with the first area in a plan view, and the second area is free of the first ferromagnetic material and is free of any other ferromagnetic material.

3. The semiconductor structure of claim 1, wherein a ferromagnetic plate selected from the array of first ferromagnetic plates has a respective maximum lateral dimension that is greater than twice a vertical dimension of the first ferromagnetic plates.

4. The semiconductor structure of claim 1, wherein a first ferromagnetic plate within the array of first ferromagnetic plates has a maximum vertical dimension less than 10 nm.

5. The semiconductor structure of claim 4, wherein the first ferromagnetic plate within the array of first ferromagnetic plates has a maximum lateral dimension in a range from 10 nm to 200 nm.

6. The semiconductor structure of claim 1, wherein a ratio of an overlap area between the inductive metal line and the array of first ferromagnetic plates in a plan view to a total area of the inductive metal line in the plan view is in a range from 0.10 to 0.90.

7. The semiconductor structure of claim 1, further comprising an array of second ferromagnetic plates in contact with the array of nonmagnetic metallic plates and comprising a second ferromagnetic material.

8. The semiconductor structure of claim 7, wherein:

the array of first ferromagnetic plates overlies the inductive metal line;

the semiconductor structure comprises an array of second ferromagnetic plates underlying the inductive metal line;

a second ferromagnetic plate selected from the array of second ferromagnetic plates comprises a second ferromagnetic material; and for any third point that is selected within volumes of the second ferromagnetic plates, a respective fourth point exists within another horizontal surface of the inductive metal line such that a line connecting the third point and the fourth point is vertical or has a second taper angle that is less than 20 degrees with respective to the vertical direction.

9. The semiconductor structure of claim 1, wherein inductive metal line comprises multiple loop segments that are interconnected to one another in a spiral configuration.

10. A semiconductor structure comprising:

semiconductor devices located on a semiconductor substrate;

metal interconnect structures located within dielectric material layers that overlie the semiconductor devices and electrically connected to the semiconductor devices;

an inductive metal line that overlies the metal interconnect structures, electrically connected to a subset of the metal interconnect structures, and laterally enclosing an area; and an array of first ferromagnetic plates overlying the metal interconnect structures, and overlying or underlying the inductive metal line, wherein, for any first point that is selected within volumes of the first ferromagnetic plates, a respective second point exists within a horizontal surface of the inductive metal line such that a line connecting the first point and the second point is vertical or has a respective first taper angle that is less than 20 degrees with respective to a vertical direction; and an array of nonmagnetic metallic plates in contact with the array of first ferromagnetic plates, wherein a nonmagnetic metallic plate selected from the array of nonmagnetic metallic plates has a substantially same area as a respective overlying or underlying first ferromagnetic plate within the array of first ferromagnetic plates.

11. The semiconductor structure of claim 10, further comprising an array of second ferromagnetic plates in contact with the array of nonmagnetic metallic plates and comprising a second ferromagnetic material.

12. The semiconductor structure of claim 10, wherein:

the array of first ferromagnetic plates overlies the inductive metal line;

the semiconductor structure comprises an array of second ferromagnetic plates comprising a second ferromagnetic material and underlying the inductive metal line; and for any third point that is selected within volumes of the second ferromagnetic plates, a respective fourth point exists within another horizontal surface of the inductive metal line such that a line connecting the third point and the fourth point is vertical or has a second taper angle that is less than 20 degrees with respective to the vertical direction.

13. A semiconductor structure comprising:

an inductive metal line located in a dielectric material layer that laterally encloses a first area;

an array of first ferromagnetic plates each comprising a first ferromagnetic material and having at least partial overlap with the inductive metal line in a plan view; and an array of nonmagnetic metallic plates in contact with the array of first ferromagnetic plates, wherein a nonmagnetic plate selected from the array of nonmagnetic metallic plates has a substantially same area as a respective overlying or underlying first ferromagnetic plate within the array of first ferromagnetic plates.

14. The semiconductor structure of claim 13, wherein the array of first ferromagnetic plates laterally encloses a second area that has a partial overlap with the first area in a plan view, and the second area is free of the first ferromagnetic material and is free of any other ferromagnetic material.

15. The semiconductor structure of claim 13, further comprising an array of second ferromagnetic plates in contact with the array of nonmagnetic metallic plates and comprising a second ferromagnetic material.

16. The semiconductor structure of claim 13, wherein:

the array of first ferromagnetic plates overlies the inductive metal line; and the semiconductor structure comprises an additional array of additional ferromagnetic plates that underlie the inductive metal line.

17. The semiconductor structure of claim 13, wherein:

the array of first ferromagnetic plates and the array of nonmagnetic metallic plates are included in a superlattice structure comprising multiple repetitions of a unit layer stack including a ferromagnetic material layer and a nonmagnetic metallic material layer; and a number of repetitions of the unit layer stack is in a range from 2 to 10, and the ferromagnetic material layer in the superlattice structure has a respective thickness less than 10 nm.

18. The semiconductor structure of claim 13, wherein:

a first ferromagnetic plate selected from the array of first ferromagnetic plates comprises a ferromagnetic material selected from the group consisting of Fe, Co, Ni, NiFe, CoFe, NiCo, NiCoFe, compound rare earth-containing ferromagnetic materials, and ferromagnetic alloys thereof; and the ferromagnetic material in the first ferromagnetic plate is doped with a dopant element selected from B, C, O, Ta, W, Zr, Pt, Mo, Mn, Ru, Mg, Hf, and Ir.

19. The semiconductor structure of claim 13, further comprising an array of second ferromagnetic plates in contact with the array of nonmagnetic metallic plates and comprising a second ferromagnetic material, wherein:

a nonmagnetic metallic plate selected from the array of nonmagnetic metallic plates comprises a nonmagnetic transition metal selected from Ta, Mo, W, Hf, Zr, Ru, Pt, and Pd and has a thickness in a range from 10 nm to 30 nm; and the nonmagnetic metallic plate is selected such that magnetization of the first ferromagnetic material in the first ferromagnetic plate is ferromagnetically or antiferromagnetically coupled, through the nonmagnetic metallic plates, to magnetization of the second ferromagnetic material in the second ferromagnetic plates.

20. The semiconductor structure of claim 15, wherein a coverage ratio of the second ferromagnetic plates, defined as a ratio of a sum of areas of the second ferromagnetic plates relative to an area of a region including the second ferromagnetic plates in a plan view, is in a range from 0.10 to 0.90.

* * * * *